(12) United States Patent
Rajski et al.

(10) Patent No.: US 8,161,338 B2
(45) Date of Patent: Apr. 17, 2012

(54) MODULAR COMPACTION OF TEST RESPONSES

(75) Inventors: Janusz Rajski, West Linn, OR (US); Wojciech Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 1527 days.

(21) Appl. No.: 11/580,650

(22) Filed: Oct. 13, 2006

(65) Prior Publication Data
US 2007/0113135 A1 May 17, 2007

Related U.S. Application Data

(60) Provisional application No. 60/727,210, filed on Oct. 14, 2005, provisional application No. 60/776,841, filed on Feb. 24, 2006.

(51) Int. Cl.
*G01R 31/3177* (2006.01)
*G01R 31/40* (2006.01)
(52) U.S. Cl. ................ 714/738; 714/726
(58) Field of Classification Search .......... None
See application file for complete search history.

(56) References Cited

U.S. PATENT DOCUMENTS

| | | | | |
|---|---|---|---|---|
| 4,491,930 A * | 1/1985 | Hyatt | | 708/3 |
| 5,414,651 A * | 5/1995 | Kessels | | 708/491 |
| 6,557,129 B1 | 4/2003 | Rajski et al. | | |
| 6,829,740 B2 | 12/2004 | Rajski et al. | | |
| 7,055,077 B2 * | 5/2006 | Kiryu et al. | | 714/726 |
| 7,370,254 B2 | 5/2008 | Rajski et al. | | |
| 7,395,473 B2 | 7/2008 | Cheng et al. | | |
| 7,409,652 B1 * | 8/2008 | Fox et al. | | 716/4 |
| 2002/0184560 A1 * | 12/2002 | Wang et al. | | 714/25 |
| 2003/0115521 A1 | 6/2003 | Rajski et al. | | |
| 2004/0117710 A1 * | 6/2004 | Patil et al. | | 714/739 |
| 2004/0230884 A1 | 11/2004 | Rajski et al. | | |
| 2005/0097419 A1 | 5/2005 | Rajski et al. | | |
| 2006/0005091 A1 * | 1/2006 | Mitra et al. | | 714/726 |
| 2006/0156144 A1 | 7/2006 | Cheng et al. | | |

OTHER PUBLICATIONS

Aho et al., *The Design and Analysis of Computer Algorithms*, pp. 294-300, 310-311 (1974).
Bardell et al., *Built-In Test for VLSI—Pseudorandom Techniques*, Chapter 8, "Built-In Test Structures," pp. 279-313 (1987).
Bayraktaroglu et al., "The Construction of Optimal Deterministic Partitionings in Scan-Based BIST Fault Diagnosis: Mathematical Foundations and Cost-Effective Implementations," *IEEE Trans. Computers*, vol. 54, No. 1, pp. 61-75 (Jan. 2005).
Clouqueur et al., "Design and Analysis of Multiple Weight Linear Compactors of Responses Containing Unknown Values," *Proc. ITC*, 10 pp. (2005).

(Continued)

*Primary Examiner* — Jeffrey A Gaffin
*Assistant Examiner* — Dipakkumar Gandhi
(74) *Attorney, Agent, or Firm* — Klarquist Sparkman, LLP

(57) ABSTRACT

Exemplary embodiments of a compactor for compacting test responses are disclosed. In certain embodiments, the compactor comprises circular registers and has multiple inputs. The circular registers can have lengths that are relatively prime or prime. In certain implementations, the compactors are able to detect errors commonly observed from real defects, such as errors of small multiplicity and burst errors. Certain embodiments of the compactor operate according to modular arithmetic. Furthermore, because circular registers do not multiply errors or unknown states, embodiments of the disclosed compactors can tolerate one or more unknown states or at least exhibit a desirably high tolerance of such states.

44 Claims, 12 Drawing Sheets

OTHER PUBLICATIONS

Damarla et al., "Multiple Error Detection and Identification via Signature Analysis," *Journal of Electronic Testing: Theory and Applications*, vol. 7, No. 3, pp. 193-207 (1995).

David, "Testing by Feedback Shift Register," *IEEE Trans. Computers*, vol. 29, No. 7, pp. 668-673 (1980).

Edirisooriya et al., "Aliasing Properties of Circular MISRs," *Journal of Electronic Testing: Theory and Applications*, vol. 4, No. 2, pp. 151-158 (May 1993).

Ghosh-Dastidar et al., "Fault Diagnosis in Scan-Based BIST Using Both Time and Space Information," *Proc. ITC*, pp. 95-102 (1999).

Ivanov et al., "On a Fast Method to Monitor the Behaviour of Signature Analysis Registers," *Proc. ITC*, pp. 645-655 (1987).

Mitra et al., "X-Tolerant Signature Analysis," *Proc. ITC*, pp. 432-441 (2004).

Mrugalski et al., Ring Generators—New Devices for Embedded Test Applications, *IEEE Trans. Computer-Aided Design*, vol. 23, No. 9, pp. 1306-1320 (Sep. 2004).

Rajski et al., "Convolutional Compaction of Test Responses," *Proc. ITC*, pp. 745-754 (2003).

Rajski et al., "Diagnosis of Scan Cells in BIST Environment," *IEEE. Trans. Computers*, vol. 48, No. 7, pp. 724-731 (1999).

Rajski et al., "Modular Compactor of Test Responses," *IEEE VLSI Test Symp*, pp. 242-251 (2006).

Savir et al., "Identification of Failing Tests with Cycling Registers," *Proc. ITC*, pp. 322-328 (1988).

Wang et al., "On Compacting Test Response Data Containing Unknown Values," *Proc. ICCAD*, pp. 855-862 (2003).

Williams et al., "Aliasing Errors in Signature Analysis Registers," *IEEE Design and Test of Computers*, pp. 39-45 (Apr. 1987).

Wohl et al., "Design of Compactors for Signature-Analyzers in Built-In Self-Test," *Proc. ITC*, pp. 54-63 (2001).

\* cited by examiner

MODULAR COMPACTION OF TEST RESPONSES

RELATED APPLICATION INFORMATION

This application claims the benefit of U.S. Provisional Patent Application Nos. 60/727,210, filed Oct. 14, 2005, and 60/776,841, filed Feb. 24, 2006, both of which are hereby incorporated herein by reference.

TECHNICAL FIELD

The disclosed technology relates generally to compression hardware used to compress test responses on a circuit-under-test, related methods and to computer media comprising computer-executable instructions for carrying out such methods.

BACKGROUND

Integrated circuits are often tested using a number of structured design-for-testability (DFT) techniques. These techniques rest on the general concept of making all or some state variables in the design under test (e.g., sequential elements, such as flip-flops, latches, and other memory elements) directly controllable and observable. If this can be arranged, a circuit can be treated, as far as the testing of combinational faults is concerned, as a combinational or a nearly combinational network.

One of the most-often-used DFT methodologies is based on scan chains. Scan-based testing assumes that during testing all (or almost all) sequential elements in the circuit design can be connected into one or more shift registers. A circuit that has been designed for scan-based testing typically has two modes of operation: a normal mode and a test (or scan) mode. In the normal mode, the memory elements perform their regular functions. In the scan mode, the sequential elements become "scan cells" that are connected to form a number of shift registers called "scan chains." These scan chains are used to shift a set of test patterns into the circuit and to shift out circuit responses to the test patterns (the test responses) after the circuit has been operated for one or more cycles in its normal mode. The test responses are then compared to fault-free responses to determine if the circuit under test (CUT) works properly.

Some DFT techniques use compactors to compress test responses unloaded from scan chains. Among the various types of compactors that can be used are so-called "time compactors." Time compactors typically comprise a feedback structure with two or more feedback loops and two or more sequential elements for storing a "signature" that represents the results of a test. After a signature is generated by the time compactor (e.g., after a full test response to a test pattern is clocked into the time compactor), the signature can be output and compared to a fault-free signature to determine if an error exists in the circuit. Among the most popular time compactors used in practice are linear feedback shift registers (LFSRs). In one basic form, a type I LFSR is modified to accept a single external input in order to act as a polynomial divider. An example of such a modified type-1 LFSR is shown as compactor 100 in FIG. 1. As shown by compactor 200 in FIG. 2, a type II LFSR can be similarly modified. In both exemplary compactors 100, 200, the input sequence, represented by a polynomial, is divided by the characteristic polynomial of the LFSR. As the division proceeds, the quotient sequence appears at the output of the LFSR and the remainder is kept in the LFSR. Once testing is completed, the content of the LFSR can be treated as the signature.

FIG. 3 shows an example 300 of another time compactor called a multiple-input LFSR, which is also known as a multiple-input signature register (MISR). A MISR is often used to test circuits having multiple scan chains. MISRs also feature a number of logic gates between the flip-flops of the shift register into which test response bits from the scan chains can be input (e.g., XOR or XNOR gates).

One desirable characteristic of any compactor is an ability to detect multiple errors (that is, two or more errors) that are present in a given test response. For example, if two faulty test response bits are unloaded from the scan chains of a circuit-under-test, the signature produced by a time compactor desirably indicates the presence of the errors in the circuit-under-test. Such detection, however, can be difficult in a time compactor on account of the feedback structure, which creates the possibility for a first error to be cancelled-out or "aliased" by a second error, thus producing a fault-free signature. Another desirable characteristic of a compactor is the ability to diagnosis errors in a circuit-under-test (e.g., to help identify or to specifically identify failing scan cells). The ability of a compactor to achieve these two characteristics can be affected by the presence of one or more unknown states in the test response (also referred to as "X states" or "X values"), which can mask a faulty test response bit and produce a non-faulty signature. Furthermore, as circuit designs and testing techniques become more complex, the ability of a compactor to tolerate unknown (or X) states is becoming increasingly important. For example, in addition to the traditional sources of X values (e.g., non-scan flip-flops, floating buses, un-initialized memory elements, design black boxes, or artifacts of clock interaction in test mode) so-called "at-speed testing" can introduce false and multi-cycle paths that also result in unknown states. Because X values are becoming more and more ubiquitous and are generally difficult to eliminate, a time compactor desirably has some ability to tolerate one or more X states.

Accordingly, there is a need for an improved time compactor and related methods.

SUMMARY

Exemplary embodiments of a compactor for compacting test responses are disclosed. In certain embodiments, the compactor comprises circular registers and has multiple inputs. The circular registers can have lengths that are relatively prime or prime. In certain implementations, the compactors are able to detect errors commonly observed from real defects, such as errors of small multiplicity and burst errors. Certain embodiments of the compactor operate according to modular arithmetic and can use Chinese remaindering to diagnose scan errors. Furthermore, because circular registers do not multiply errors or unknown states, embodiments of the disclosed compactors can tolerate one or more unknown states or at least exhibit a desirably high tolerance of such states.

In some disclosed embodiments, a circuit for compacting test responses includes two or more circular registers that comprise sequential elements and input logic gates. The input logic gates can be configured to receive test response bits and to logically combine the test response bits with bits stored within a respective one of the circular registers. The circuit can further include a first path having a first-path input coupled to a first scan chain output and first-path outputs coupled to a first set of the input logic gates. The circuit can also include a second path having a second-path input coupled to a second scan chain output and second-path outputs coupled to a second set of the input logic gates. The second set of the input logic gates can comprise at least one input logic gate that is different than the input logic gates in the first set. In some implementations, each of the two or more circular registers has a length corresponding to the number of sequential elements in the respective register. The lengths of the two or more circular registers can be, for example, relatively prime or prime. In certain implementations, the input logic gates can be XOR or XNOR gates. A demultiplexing circuit can also be coupled to the two or more circular registers. For example, the demultiplexing circuit can be selectively controllable to output signatures stored in the two or more circular registers.

In certain other disclosed embodiments, a circuit for compacting test responses comprises a first register and second register. The first register can comprise first-register sequential elements and a first-register feedback loop. Further, at least some of the first-register sequential elements can be coupled together through one or more first-register logic gates. The second register can comprise second-register sequential elements and a second-register feedback loop. Further, at least some of the second-register sequential elements can be coupled together through one or more second-register logic gates. The circuit can further comprise an injector network configured to couple a first scan-chain output to a first respective first-register logic gate and to a first respective second-register logic gate. The injector network can be further configured to couple a second scan-chain output to the first respective first-register logic gate and to a second respective second-register logic gate different than the first respective second-register logic gate. At least one of the first-register feedback loop or the second-register feedback loop can be fanout free. Similarly, the first-register feedback loop can couple the output of a last sequential element in the first register to the input of a first sequential element in the first register and/or the second-register feedback loop can couple the output of a last sequential element in the second register to the input of a first sequential element in the second register. In some implementations, the register and the second register are circular registers.

Various exemplary methods are also disclosed. For example, in some of the disclosed methods, a first test response bit is loaded into a first set of sequential elements, and a second test response bit is loaded into a second set of sequential elements. In these methods, both the first set of sequential elements and the second set of sequential elements can comprise at least one sequential element in the first circular register and at least one sequential element in the second circular register. The second set can further comprise at least one sequential element that is different from the sequential elements of the first set. The first and the second test response bits can be loaded through logic gates in the first and the second circular registers that combine the test response bits with bits previously stored in the respective circular registers. The acts of loading the first test response bit and loading the second test response bit can occur during a same clock cycle. Or, the first test response bit and the second test response bit can both be error bits (e.g., error bits captured in any two scan cells of a circuit-under-test), and the method can further comprise generating a signature indicative of the presence of the error bits. Alternatively, the first test response bit can be an error bit (e.g., an error bit captured in any scan cell of a circuit-under-test), and the method can further comprise generating a signature indicative of the presence of the error bit and an identity of a scan cell in a circuit-under-test that captured the error bit. The first test response bit can be an error bit (e.g., an error bit captured in any scan cell of a circuit-under-test) and the second test response bit can have an unknown state (e.g., an unknown state captured in any other scan cell of the circuit-under-test), and the method can further comprise generating a signature indicative of the presence of the error bit. The first test response bit can be received from a first scan chain output and the second test response bit can be received from a second scan chain output. Compactors for performing these exemplary methods are also disclosed.

In some disclosed embodiments, computer-implemented methods are described wherein circuit design information for a circuit is received. The circuit design information can include design information for two or more scan chains. Compactor design information can be created for implementing a test response compactor for the circuit. This process can include creating an injector network for coupling scan chain outputs of at least two of the scan chains to at least two circular registers. The compactor design information can then be stored. In some implementations, the act of creating the injector network can comprise, for example, creating pathways between the scan chain outputs and the circular registers such that each of the scan chain outputs is coupled to at least one input logic gate configured to load a respective sequential element in each of the at least two circular registers. The act of creating the injector network can also comprise creating a first pathway that couples a first scan chain output to a first set of sequential elements, and creating a second pathway that couples a second scan chain output to a second set of sequential elements. The first set and the second set can include at least one sequential element in each of the at least two circular registers, and the second set can include at least one sequential element not coupled to the first scan chain output. The act of creating the injector network can comprise creating a pathway that couples a scan chain j having a leading scan cell number jL to a sequential element jL mod r of a selected one of the circular registers, where r is the length of the selected circular register, the sequential elements within the selected register are numbered consecutively, the scan cells in the two or more scan chains are numbered consecutively, and the length of the two or more scan chains is L such that the scan chain j has the leading scan cell jL. Further, the two or more circular registers can have respective lengths that do not share a common divisor or that are prime.

In other exemplary computer-implemented methods disclosed herein, one or more failing signatures are received from a multiple-input time compactor comprising two or more circular registers. Positions of one or more failing bits in a selected failing signature of the two or more failing signatures can be determined. One or more scan cells that captured faulty test response values can be identified by applying modular arithmetic to the determined positions of the one or more failing bits. A list of the one or more identified scan cells can be stored. The act of identifying the one or more scan cells that captured faulty test response values can include determining $$c = \left( \sum_{i=0}^{m-1} q_i z_i s_i \right)$$

mod R, where c is a scan cell number that originated the error, m is the total number of circular registers in the time compactor, $r_i$ is the length of a circular register i, $$q_i = \left( \prod_{j=0}^{m-1} r_j \right) / r_i,$$

$z_i$ is the inverse $q_i^{-1}$ mod $r_i$, $s_i$ is the position in the signature of circular register i having an error bit, and R is the product of the lengths of all the circular registers in the time compactor.

Any of the disclosed methods can be implemented as computer-readable media comprising computer-executable instructions for causing a computer to perform the methods. Further, computer-readable media storing signatures produced by any of the disclosed compactors, storing lists of fault candidates or faulty scan cell candidates identified by any of the disclosed methods, or storing circuit descriptions for implementing any of the disclosed compactor embodiments are also disclosed.

The foregoing and other objects, features, and advantages of the disclosed technology will become more apparent from the following detailed description, which proceeds with reference to the following drawings.

DETAILED DESCRIPTION

General Considerations

Figure 1:
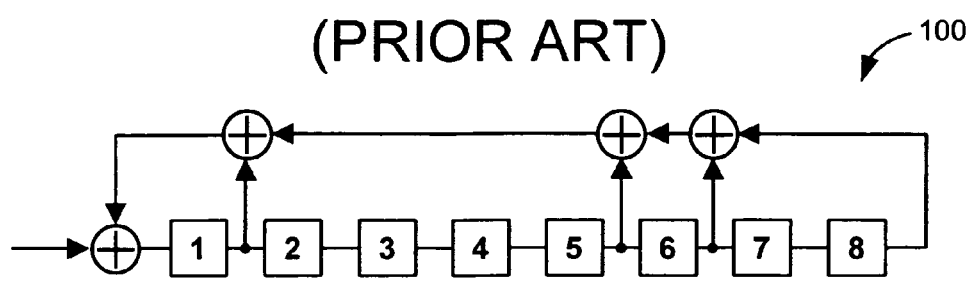
FIG. 1 is a schematic block diagram of a type I LFSR compactor.
Figure 2:
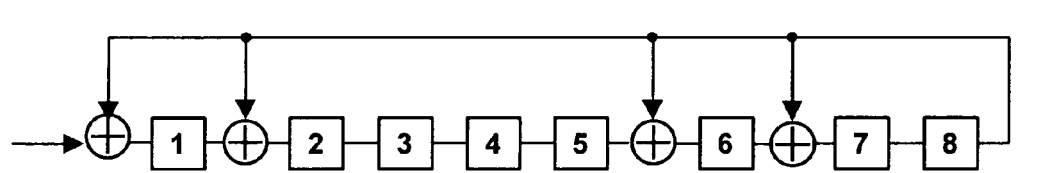
FIG. 2 is a schematic block diagram of a type II LFSR compactor.
Figure 3:
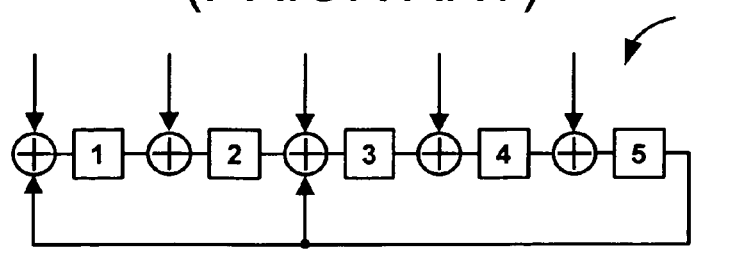
FIG. 3 is a schematic block diagram of a multiple input signature register (MISR) compactor.

Described herein are embodiments of compactors that can exhibit improvements in one or more of the following performance areas: error non-masking, diagnostics, and X-tolerance. The exemplary compactor embodiments and methods for using and designing such embodiments described herein should not be construed as limiting in any way. Instead, the present disclosure is directed toward all novel and nonobvious features and aspects of the various disclosed apparatus and methods, alone and in various combinations and subcombinations with one another. The disclosed technology is not limited to any specific aspect or feature, or combination thereof, nor do the disclosed methods and apparatus require that any one or more specific advantages be present or problems be solved.

As used in this application and in the claims, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "list" refers to a collection or arrangement of data that is usable by a computer system. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database).

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus.

The disclosed compactor embodiments can be implemented in a wide variety of integrated circuits that utilize scan-based testing (e.g., application-specific integrated circuits (ASICs) (including mixed-signals ASICs), systems-on-a-chip (SoCs), or programmable logic devices (PLDs) such as field programmable gate arrays (FPGAs)). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on a computer-readable medium. Such software can comprise, for example, an electronic-design-automation (EDA) software tool, such as a design, verification, or simulation tool. Similarly, any of the methods described herein (e.g., the compactor design methods) can be performed using software comprising computer-executable instruction stored on one or more computer-readable storage media. Any such software can be executed on a single computer or on a networked computer (e.g., any commercially available computer or computer network). For example, such software can be executed in a networked environment, such as over the Internet, a wide-area network, a local-area network, a client-server network, or other suitable network. For clarity, only certain selected aspects of the software-based implementations are described. Other details that are well known in the art are omitted. For example, it should be understood that the disclosed technology is not limited to any specific computer language, program, or computer. Because suitable computer architectures for implementing such software are well known in the art, such architectures and other computer hardware are not described in further detail.

Any of the disclosed apparatus can also be stored as circuit design information on one or more computer-readable media. For example, a process of designing the compactor can include storing computer design information for implementing the compactor on one or more computer-readable media. Such design information can be stored as a netlist, HDL file, GDSII file, Oasis file, or other suitable design file representative of the compactor. The design information can also be updated to include additional or alternative design information. Similarly, a database or file containing results from any of the disclosed fault diagnosis procedures can be created or updated and stored on one or more computer-readable storage media. Such databases or files can be created or updated at a local computer or over a network (e.g., by a server computer).

Exemplary Modular Compactor Architectures

Figure 4:
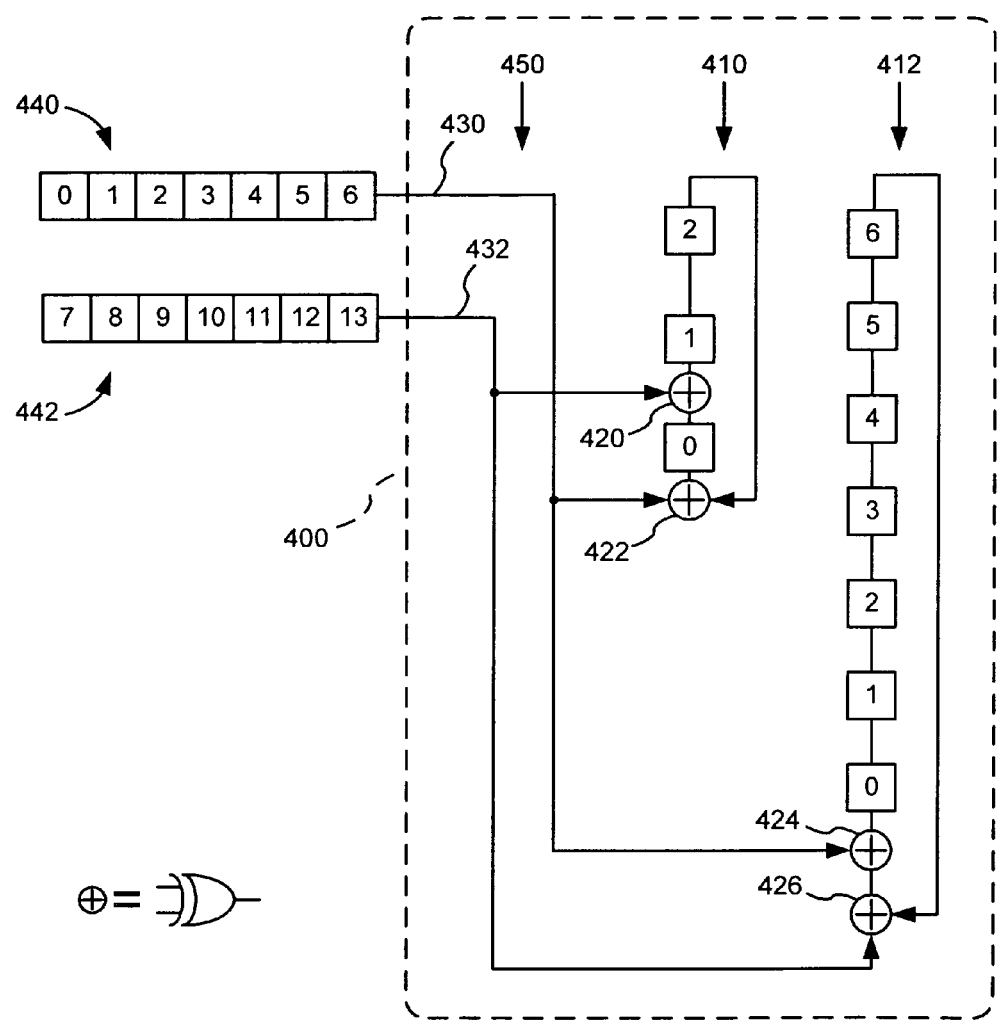
FIG. 4 is a schematic block diagram of an exemplary modular compactor designed according to the disclosed technology.

FIG. 4 shows an exemplary embodiment of a modular compactor 400 coupled to two exemplary scan chains 440, 442 of a circuit-under-test. The modular compactor 400 comprises a first register 410 and a second register 412. Each of the registers 410, 412 comprises one or more sequential elements (e.g., flip-flops, latches, or other memory elements). The sequential elements of the registers 410, 412 are serially coupled to one another in this example such that the output of one sequential element at least partially contributes to the input of a next sequential element. For illustrative purposes, the sequential elements in the FIG. 4 embodiment are consecutively numbered according to the direction in which bits within the register are shifted. Thus, for instance, sequential element 0 of the first register 410 outputs a bit that at least partially contributes to the input of sequential element 1 of the first register. The scan cells of the scan chains 440, 442 are also consecutively numbered but, for explanation purposes, are assigned a unique number for each scan cell. This numbering convention is used throughout this disclosure unless specified otherwise.

Each of the registers 410, 412 additionally comprises at least one feedback loop. In the illustrated embodiment, for example, a single feedback loop couples the last respective sequential element of each of the registers 410, 412 with the first sequential element in the respective registers 410, 412. Registers having only one such feedback loop are termed "circular registers," "cycling registers," or "rotating registers" because a bit input into the register cycles around the register in step with a clock signal pulsing the register until the bit is combined with another bit. A circular register can also be defined as a shift register having the characteristic polynomial $f(x)=1+x^n$, where n is the number of sequential elements.

Each of the registers 410, 412 has an associated length, measured by the number of sequential elements in the respective register. Thus, in the illustrated embodiment, the first register 410 has a length of 3 and the second register 412 has a length of 7. The lengths of the registers in embodiments of the modular compactor can vary widely depending on the implementation. In certain desirable embodiments, however, the lengths are prime. That is, the lengths of each register in the modular compactor is a prime number. In certain other desirable embodiments, and more generally, the lengths of the registers are relatively prime. That is, the lengths of the registers in the modular compactor do not share a common divisor. The lengths of the registers 410, 412 (3 and 7, respectively) are both prime and relatively prime. By contrast, if the second register 412 had 8 sequential elements, the lengths of the registers would only be relatively prime, as 8 is not a prime number but does not share a divisor with 3.

The registers 410, 412 further comprise a plurality of input logic gates through which bits of the test response (test response bits) can be input into the registers 410, 412. For example, in the illustrated embodiment, the first register 410 comprises input logic gates 420, 422, and the second register comprises input logic gates 424, 426. In general, input logic gates are coupled between pairs of sequential elements in a register of a modular compactor so that bits being input into the register are logically combined with bits within the register. For example, input logic gate 420 logically combines a bit output from path 432 with a bit output from sequential element 0 of the first register 410. In particular, logic gate 420 can perform an exclusive-or (XOR) function on the two bits. The input logic gates can comprise any one or more suitable logic gate, such as an XOR, XNOR, or other suitable logic gate The exemplary compactor 400 further comprises a first path 430 and a second path 432 configured to inject test patterns bits form the scan chains 440, 442 into the registers 410, 412. In the illustrated embodiment, for example, the first input path 430 has an input coupled to an output of a first scan chain 440 and fans out to two outputs coupled respectively to the logic gates 422, 424. The second pathway 432 has an input coupled to an output of a second scan chain 442 and fans out to two outputs coupled to the respective logic gates 420, 426. Collectively, the input paths 430, 432 comprise one exemplary form of an injector network 450. In general, the injector network of a modular compactor is configured to route test pattern bits unloaded from the scan chains of the circuit-under-test into the registers of the compactor according to some predetermined injection pattern. For example, in certain embodiments, the injector network is configured so that a scan chain of the circuit-under-test is connected to at least one input logic gate of each register in the compactor. Furthermore, and as more fully explained below, the injector network can be configured so that at least two of the scan chain outputs are not connected to the same set of sequential elements in the registers. For instance, the injector network can be configured to couple one scan chain output to a first set of sequential elements and couple another scan chain output to a second set of sequential elements, where at least one of the sequential elements in the second set is different than the sequential elements in the first set.

Figure 5:
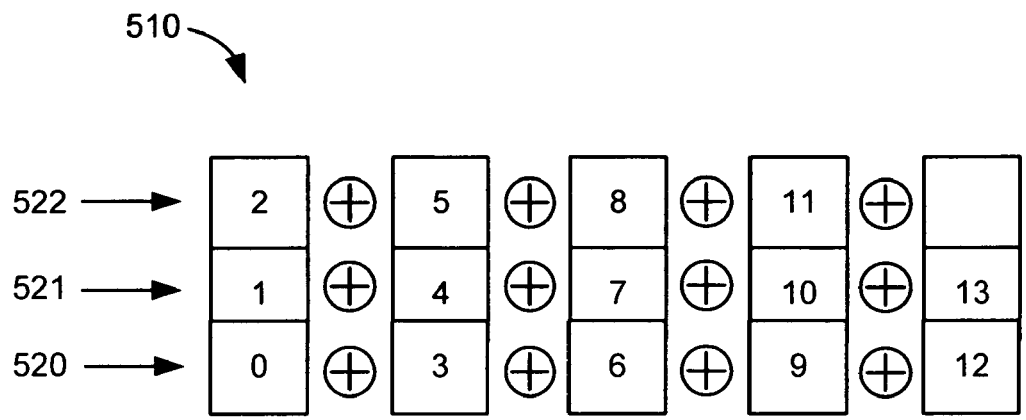
FIG. 5 is a block diagram conceptually illustrating the contents of the sequential elements in the circular registers of the exemplary modular compactor illustrated in FIG. 4.
Figure 5:
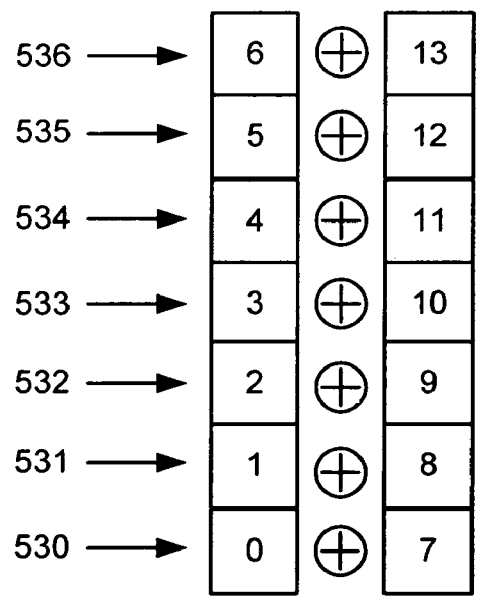

FIG. 5 is a block diagram conceptually illustrating the location of the test-pattern bits from the scan cells of the scan chains 410, 412 after they are fully unloaded into the exemplary modular compactor 400 of FIG. 4. Specifically, representation 510 illustrates the content of the first register 410 after unloading, and representation 512 illustrates the content of the second register 412 of the modular compactor 400 after unloading. Rows 520, 521, and 522 represent the respective values stored in sequential elements 0, 1, and 2 of the first register 410, whereas rows 530 through 536 represent the respective values stored in the second register 412. Thus, for example, row 520 indicates that after the scan chains are fully unloaded, the sequential element 0 of the first register 540 will have a value equal to 0⊕3⊕6⊕9⊕12, where ⊕ represents the XOR function, and 0, 3, 6, 9, and 12 represent the values stored in scan cells 0, 3, 6, 9, and 12, respectively.

FIG. 5 also illustrates one possible characteristic that can be realized in certain embodiments of the disclosed compactors—namely, the ability to tolerate at least some multiplicity or multiple of errors. For example, the modular compactor 400 can tolerate double errors and odd-numbers of errors. Consider, for example, error bits captured at scan cell 7 and scan cell 1. As shown by row 521, the two error bits will effectively cancel each other out, or "mask" one another, in the first register 410. Thus, the signature produced by the first register 410 will not indicate the presence of a defect in the circuit-under-test. In the second register 412, however, the errors will not be masked. As shown by row 531, the error bit at scan cell 1 will appear unmasked in sequential element 1 of the second register 412, and, as shown by row 530, the error bit at scan cell 7 will appear unmasked in sequential element 0 of the second register 412.

It should be understood that the number of scan chains, scan cells in the scan chains, registers, sequential elements in the registers, input logic gates, and pathways of the injector network shown in FIG. 4 are for illustrative purposes only. Actual implementations of the modular compactor can comprise any number of these elements and can have injection networks that vary from implementation to implementation (e.g., based the particular testing needs for the circuit-under-test).

Figure 6:
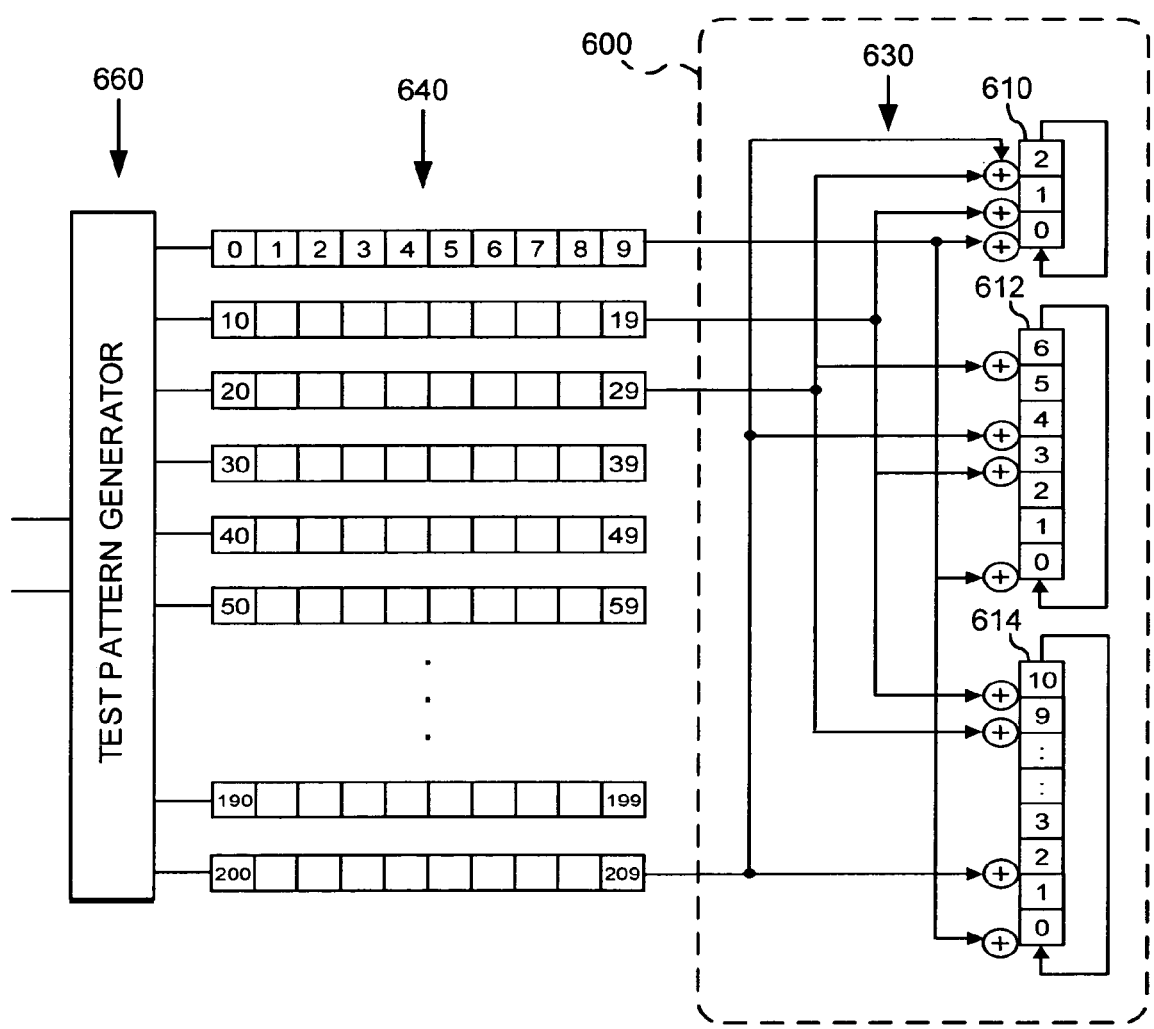
FIG. 6 is a schematic block diagram of another exemplary modular compactor designed according to the disclosed technology.

FIG. 6, for instance, shows an example of a larger modular compactor 600 for compacting test responses from multiple scan chains. In particular, modular compactor 600 is configured to compress test response bits from 21 scan chains in a circuit-under-test, which are collectively shown as scan chains 640 in FIG. 6. Also shown in FIG. 6 is a test pattern generator 660 configured to load the scan chains 640 with test pattern bits during testing. The test pattern generator 660 can comprise any suitable test pattern generator (e.g., a pseudo-random pattern generator (PRPG), a decompressor for decompressing deterministic test patterns (such as an EDT decompressor as described in U.S. Patent Application Publication No. 2003/0120988), or a hybrid generator/decompressor (such as an EDT decompressor/PRPG as described in U.S. Patent Application Publication No. 2004/0128599)). In one embodiment, for example, the test pattern generator 660 is a hybrid design capable of generating pseudorandom patterns in a BIST mode and decompressing deterministic patterns in a test decompression mode. One example of such a circuit is described, for instance, in G. Mrugalski et al, "Ring generators—new devices for embedded test applications," *IEEE Trans. Computer-Aided Design*, vol. 23, pp. 1306-1320 (September 2004).

In FIG. 6, the exemplary scan chains 640 are each ten scan cells long. Furthermore, the scan cells in FIG. 6 are numbered from 0 to 209. Again, the number of scan chains and the size of the scan chains shown in FIG. 6 are for illustrative purposes only and are not limiting.

The modular compactor 600 in this example further comprises three registers 610, 612, 614. In the illustrated embodiment, the registers 610, 612, 614 are circular registers of both prime and relatively prime length (3, 7, 11). For ease of illustration, the connections between the sequential elements in the registers are not shown but are readily discernible from the illustration. In FIG. 6, the scan chains are coupled to the registers via XOR gates, which form part of an exemplary injector network, shown collectively as injector network 630.

The XOR gates in the illustrated embodiment are coupled to the sequential elements of the registers so that a scan chain having a leading scan cell x (that is, the scan cell directly coupled to the test pattern generator 660 is scan cell x) is coupled to a sequential element x mod r of a register, where r is the length of the register. Thus, as illustrated in FIG. 6, the scan chain having scan cells 20 to 29 and having a leading scan cell 20 is coupled to sequential element 2 of the first register 610 (20 mod 3=2), sequential element 6 of the second register 612 (20 mod 7=6), and sequential element 9 of the third register 614 (20 mod 11=9). As more fully explained below, such a configuration produces certain desirable performance characteristics in the modular compactor.

Figure 15:
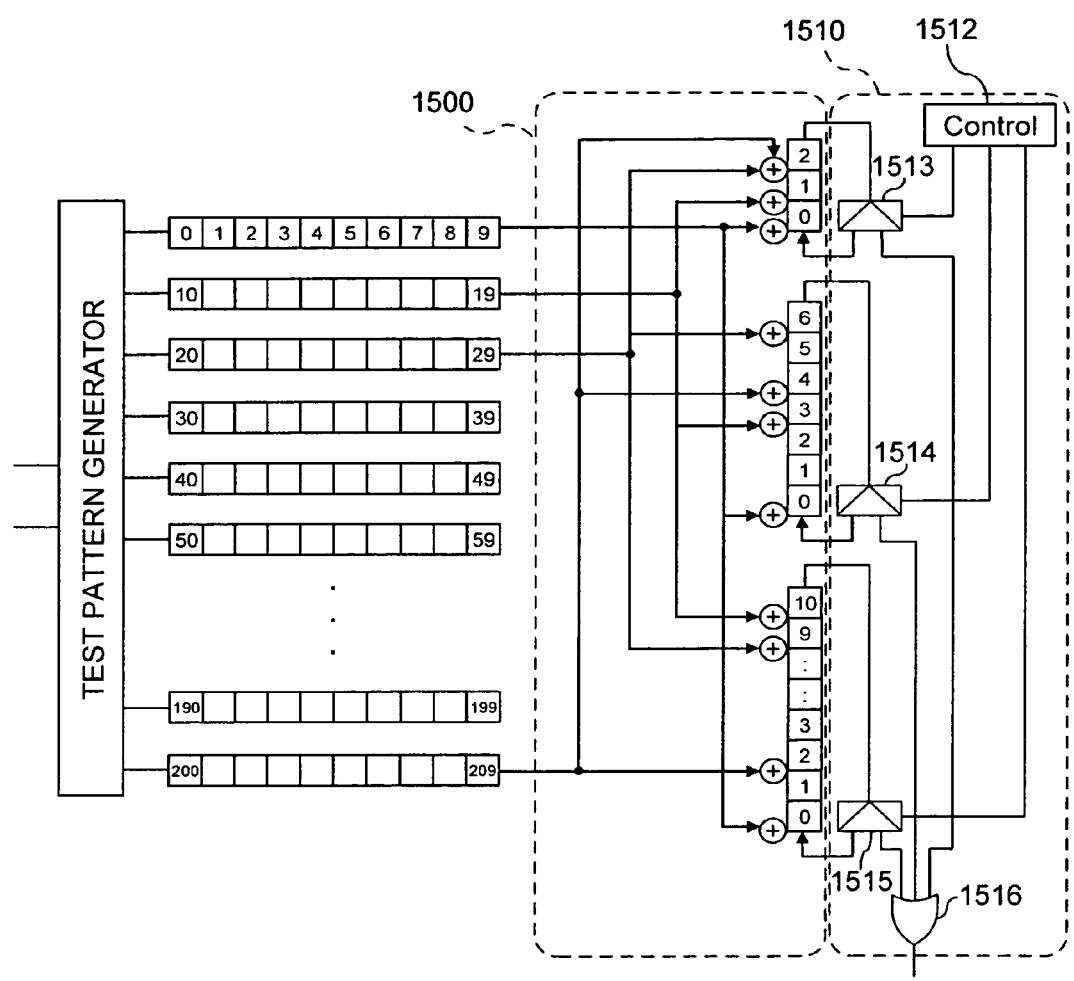
FIG. 15 a schematic block diagram of another exemplary embodiment of a modular compactor designed according to the disclosed technology.

Table 1 provides a complete list of assignments of scan chains to sequential elements in the registers of the FIG. 6 embodiment. A simple de-multiplexing circuit (not shown in FIG. 6, but illustrated in FIG. 15 below) can provide a flexible, low area overhead mechanism to read out the compacted responses. For example, the compacted responses can be read every cycle, once every two or more cycles, every pattern, once every two or more patterns, or once for hundreds or thousands of patterns. Unless otherwise stated herein, it should be assumed in these specific examples (although not required) that one signature is computed and read out for every test pattern.

TABLE 1

Assignments of scan chains to circular registers for example design of FIG. 6

| Leading Cell | Reg 3 | Reg 7 | Reg 11 | Cell | Reg 3 | Reg 7 | Reg 11 |
| --- | --- | --- | --- | --- | --- | --- | --- |
| 0 | 0 | 0 | 0 | 110 | 2 | 5 | 0 |
| 10 | 1 | 3 | 10 | 120 | 0 | 1 | 10 |
| 20 | 2 | 6 | 9 | 130 | 1 | 4 | 9 |
| 30 | 0 | 2 | 8 | 140 | 2 | 0 | 8 |
| 40 | 1 | 5 | 7 | 150 | 0 | 3 | 7 |
| 50 | 2 | 1 | 6 | 160 | 1 | 6 | 6 |
| 60 | 0 | 4 | 5 | 170 | 2 | 2 | 5 |
| 70 | 1 | 0 | 4 | 180 | 0 | 5 | 4 |
| 80 | 2 | 3 | 3 | 190 | 1 | 1 | 3 |
| 90 | 0 | 6 | 2 | 200 | 2 | 4 | 2 |
| 100 | 1 | 2 | 1 | | | | |

Modular Arithmetic for Describing Embodiments of the Disclosed Compactor

In this section, arithmetic for describing embodiments of the disclosed modular compactors is introduced. In the following sections, the arithmetic is used to formally describe various characteristics that can be realized in embodiments of the disclosed technology.

In this paragraph, an exemplary configuration of a modular compactor (termed the "model configuration") is described. Embodiments of modular compactors having the model configuration have m circular registers of relatively prime length $r_0, r_1, r_2, \ldots, r_{m-1}$. The compactor range R in these embodiments can be defined as a product of the register lengths, for example:

$$R = \prod_{i=0}^{m-1} r_i,$$

where the sequential elements within a register i are represented as $0, 1, 2, \ldots, r_i-1$. For purposes of this discussion and without loss of generality, assume that there are J scan chains of equal length L, with the possible exception of one, coupled to embodiments of the modular compactor having the model configuration. Assume also that the scan cells in the scan chains are sequentially numbered from $0, 1, 2, \ldots,$ to $N-1$ and that every scan chain output is coupled to a sequential element in each register. According the exemplary model configuration, the injector network is configured such that a scan chain j with a leading cell number jL is coupled to flip-flop number $jL \bmod r_i$ of register $r_i$, for $j=0, 1, 2, \ldots J-1$ and $i=0, 1, \ldots, m-1$.

Analysis of Diagnostic Capabilities in Exemplary Compactor Embodiments

For the model configuration, if c represents a position of an error in a scan chain feeding the compactor, then its corresponding position $s_i$ of the error in the signature can be determined as the remainder of a modulo $r_i$ operation—namely, $s_i = c \bmod r_i$, where $r_i$ is the register size. Using the Chinese Remainder Theorem, it can be shown that if the content of a scan chain is unloaded into a compactor having the model configuration, each scan cell error will produce a different signature. The Chinese Remainder Theorem is described, for example, in A. V. Aho et al, *The design and analysis of computer algorithms* (Addison-Wesley, 1974). As applied to the disclosed compactor architecture, the theorem can be restated as follows:

Theorem 1: Let c be a scan cell number and $(s_0, s_1, s_2, \ldots s_{m-1})$ be its corresponding signature defined as a set of remainders $s_i = c \bmod r_i$, $0 \leq s_i < r_i$, for $0 \leq i < m$. Then, every two different scan cells c and d, where $0 \leq c < R$, $0 \leq d < R$, $c \neq d$, generate different signatures.

To find an erroneous scan cell from the set of recorded remainders, the following theorem can be used:

Theorem 2: Let $q_i$ be the product of all the $r_j$'s except $r_i$, $$q_i = \left(\prod_{j=0}^{m-1} r_j\right) / r_i.$$

Also let $z_i$ be an inverse $q_i^{-1} \bmod r_i$, that is $q_i z_i = 1 \bmod r_i$, and $0 \leq z_i < r_i$. Then, based on the recorded set of remainders $(s_0, s_1, s_2, \ldots s_{m-1})$, the scan cell number c that originated the error can be determined as:

$$c = \left(\sum_{i=0}^{m-1} q_i z_i s_i\right)$$

mod R.

Consider, for example, a compactor having the model configuration and five registers of size 23, 25, 27, 29, and 31. Assume also that the compactor records remainders 2, 5, 13, 8, and 30, respectively. The range of this example compactor is 13,956,975. The corresponding $q_i$'s are 606825, 558279, 51625, 481275, 450225, and the inverse $z_i$'s are 13, 19, 19, 16, and 13. The increase of distance by 606825*13, increments remainder $s_i$ by 1 modulo 23, (606825*13)mod 23=1, while preserving all other remainders. Similarly, (558279*19)mod 25=1, (51625*19)mod 27=1, (481275*16) mod 29=1, and (450225*13)mod 31=1. The set of recorded remainders 2, 5, 13, 8, and 30 thus corresponds to an error on scan cell c, c=(606825*13*2+558279*19*5+51625*19*13+ 481275*16*8+450225*13*30)mod 13,956,975=1,019,155. A simple verification shows that the error in scan cell 1,019, 155 indeed produces the observed set of remainders: 1,019, 155 mod 23=2, 1,019,155 mod 25=5, 1,019,155 mod 27=13, 1,019,155 mod 29=8, and 1,019,155 mod 31=30.

In one exemplary technique for diagnosing a circuit-under-test, failing signatures produced from a modular compactor are received (e.g., from a modular compactor having the model configuration). For instance, failing signatures identified during testing (e.g., by a tester) can be stored on a computer-readable medium and read by a software tool adapted to perform circuit diagnostics. The positions of the errors in the signatures can be determined. The positions of the errors in the signatures correspond to the set of remainders produced by a scan cell capturing a faulty test response value. Using the positions of the errors in the signatures, the one or more scan cells that captured the error values (the one or more faulty scan cells) can be determined. For example, modular arithmetic as explained above can be used. In particular embodiments, the faulty scan cells can be identified using Theorem 2. The identification of the faulty scan cells can then be stored (e.g., in a list of faulty scan cells). From the faulty scan cells identified, one or more possible circuit defects can be determined (e.g., using a dictionary-based diagnostic technique, an effect-cause-based diagnostic technique, direct diagnosis technique, or other suitable diagnostic technique). In certain instances, the circuit design or manufacturing process can then be modified to help eliminate the defect.

Analysis of Error Aliasing in Exemplary Embodiments

To analyze the aliasing probability in exemplary embodiments of the disclosed modular compactor architecture, the methodology described in T. W. Williams, W. Daehn, M. Gruetzner, and C. W. Starke, "Aliasing errors in signature analysis registers," *IEEE Design and Test of Computers*, vol. 4, pp. 39-45 (April 1987) can be used. In general, the methodology builds on a stationary independent error model where an error occurs independently at each position in the test-response sequence having an error probability $p_e$.

First, the number of states reachable from the initial all 0 state is determined. For the model configuration introduced above, the following theorem can be used to determine the number of reachable states:

Theorem 3: the number of reachable states in a modular compactor having the model configuration with m registers of relatively prime lengths $r_0, r_1, r_2, \ldots, r_{m-1}$ is $2^{\sum_0^{m-1} r_i - (m-1)}$.

This theorem can be proven by first observing that every bit of the first register can be set or reset independently of other bits. The register therefore can reach all of its $2^{r_0}$ states. Half of them, $2^{r_0-1}$, are the result of an odd number of error injections and the other half correspond to an even number of errors. Given that every scan chain connects to all registers, the states that involve odd number of errors on some registers and even number on others are not reachable. The relatively prime length of the registers makes it possible to achieve any combination of odd injections and even injections. Hence, the total number of reachable states is $2^{r_0-1} 2^{r_1-1} \ldots 2^{r_{m-1}-1} + 2^{r_0-1} 2^{r_1-1} \ldots 2^{r_{m-1}-1}$ or $2^{r_0+r_1+\cdots+r_{m-1}-m+1}$.

It is possible to demonstrate that the process is irreducible, aperiodic, and doubly stochastic. In a process with these properties, in a steady state, the reachable states are equally likely. The probability of returning to the all 0 state, known also as error aliasing, can be determined by the following theorem.

Theorem 4: The steady state probability of error aliasing in a modular compactor having the model configuration with m registers of relatively prime length $r_0, r_1, r_2, \ldots, r_{m-1}$, under the stationary independent error model, $p_e \neq 0,1$, is: $2^{-(\Sigma_0^{m-1} r_i - (m-1))}$.

Figure 7:
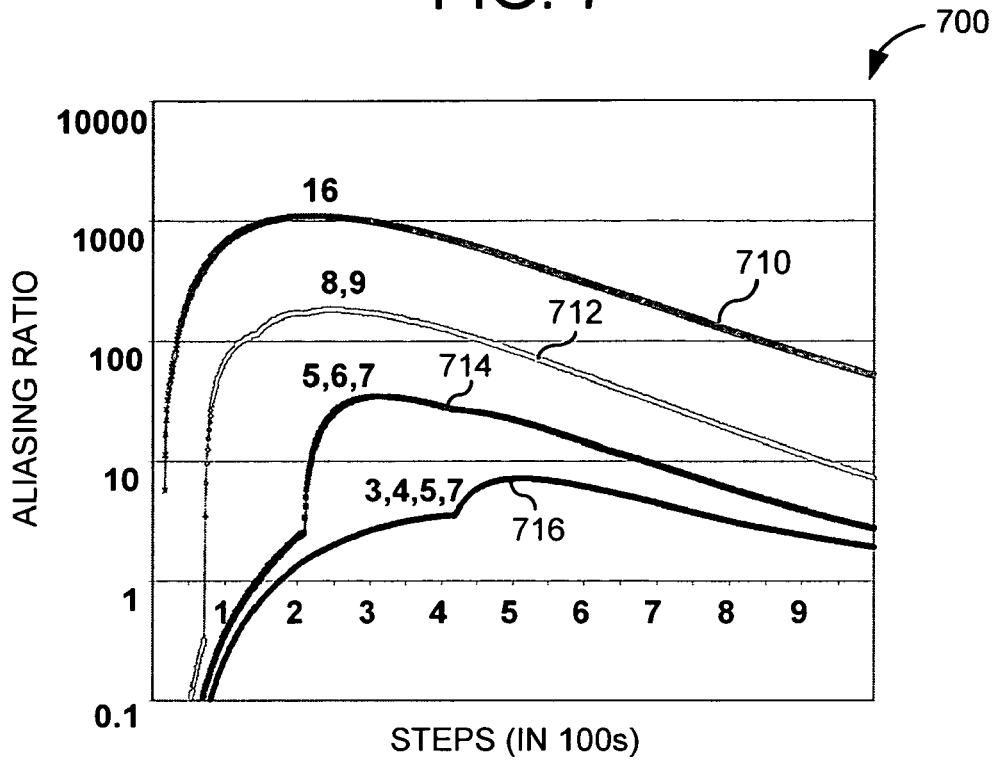
FIG. 7 is a graph showing the aliasing ratio relative to a steady state model versus the steps of test response compaction for several exemplary modular compactors and a bit error probability of 1%.

In order to understand the dynamics of the process, a Markov chain simulator, which computes state probabilities for steps of test response compaction, can be used. FIG. 7 is a graph 700 showing the aliasing ratio relative to a steady state model versus the steps of test response compaction for several exemplary modular compactors and for a bit error probability of 1%. Plot 710 shows the aliasing ratio for a compactor with one register of length 16; plot 712 shows the aliasing ratio for a compactor with two registers of lengths 8, and 9; plot 714 shows the aliasing ratio for a compactor with three registers of lengths, 5, 6, and 7; and plot 716 shows the aliasing ratio for a compactor with four registers of lengths 3, 4, 5, and 7.

These exemplary compactors have the same number of reachable states $2^{16}$ and the same steady state probability of aliasing $2^{-16}$. As shown in FIG. 7, the single-register compactor can reach an intermediate probability of aliasing that is about 1000 times larger than the steady state one. This is consistent with results known in the field. On the other hand, the exemplary four-register compactor shown in plot 714 and having similar hardware reduces intermediate aliasing by two orders of magnitude to less than 8 times the steady state value.

Figure 8:
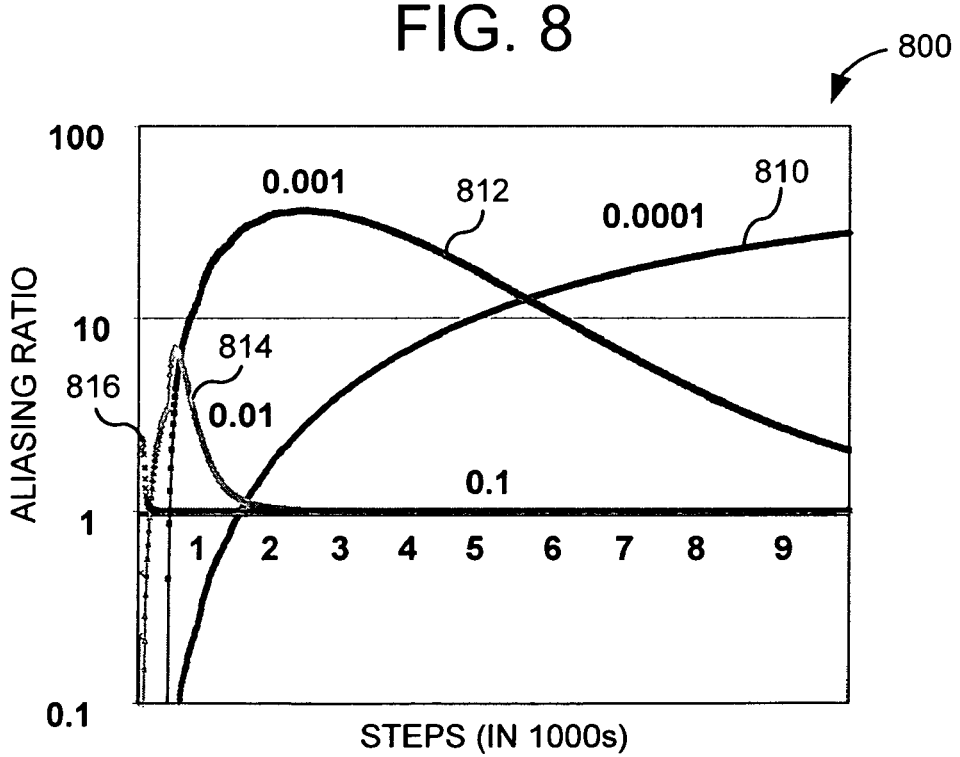
FIG. 8 is a graph showing the aliasing ratio for an exemplary compactor having four registers of lengths 3, 4, 5, and 7 and for several values of error probability.

FIG. 8 is a graph 800 showing the process dynamics for one exemplary compactor having four registers of lengths 3, 4, 5, and 7 and for several values of error probability. In particular, plot 810 corresponds to an error probability 0.0001, plot 812 corresponds to an error probability of 0.001, plot 814 corresponds to an error probability of 0.01, and plot 816 corresponds to an error probability of 0.1. As can be seen by FIG. 8, the higher the value of $p_e$, the faster the process reaches the steady state probability of aliasing. Also, for very low values of $p_e$, the process has a much longer transition period and reaches a higher maximum value.

Analysis of Error Masking Properties in Exemplary Compactor Embodiments

Figure 9:
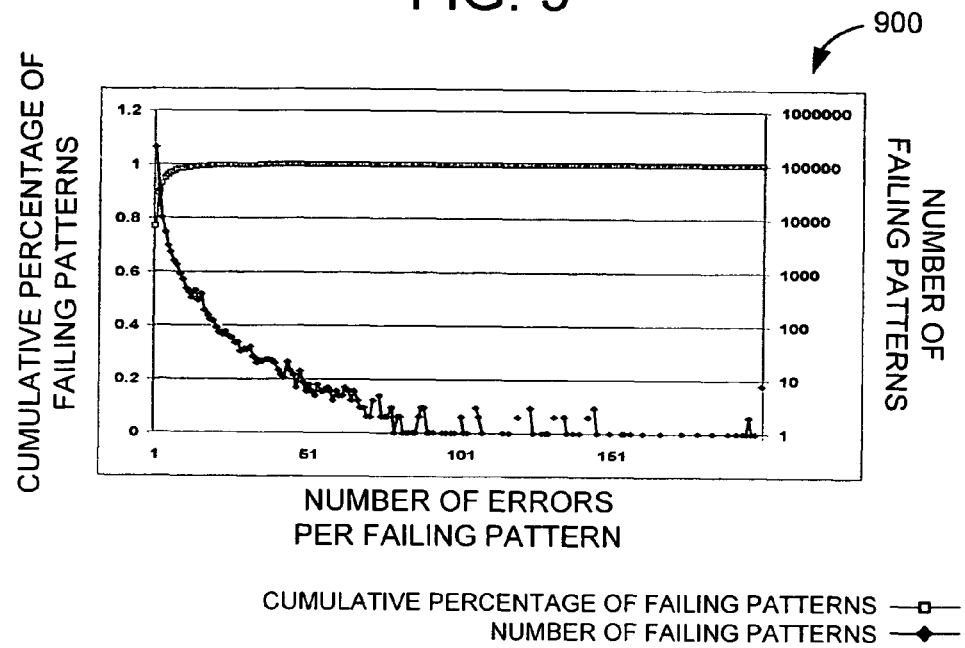
FIG. 9 is a graph showing error statistics for failing test responses generated by an exemplary circuit design.

Another way to analyze error masking in compaction schemes is to consider discrete errors of finite multiplicity. FIG. 9, for example, is a graph 900 showing discrete error statistics from an 8 million gate design fabricated in 110 nm copper technology. Plot 910 indicates what percentage of all failing patterns exhibit the number of errors displayed on the x axis, whereas plot 912 indicates how many of the failing patterns exhibit the errors displayed on the x axis.

The data shown in FIG. 9 comes from 3000 failing devices and displays results for a total of a quarter of a million failing patterns. FIG. 9 shows that a single error occurred in 77% of the failing patterns, a double error in 12%, a triple error in 4%, and a quadruple error in 2%. Ten or fewer errors explain more than 98% of all failing patterns.

A compactor designed according to the model configuration introduced above is capable of detecting certain multiplicities of errors in the presence of unknown (or X) states. Specifically, Theorem 5: a modular compactor having the model configuration can detect odd multiplicity errors if the test response does not have X states.

The proof for this theorem proceeds by observing that, in a single register, the total odd number of errors injected into the register breaks down into at least one or more flip-flops with an odd number of errors and a set, possibly empty, of flip-flops that has an even number of errors. The flip-flop with an odd number of errors guarantees detection of the odd scan error.

Furthermore, in modular compactors having the model configuration, double error masking does not occur so long as the total number of scan cells is less than or equal to the compactor range. Based on Theorem 1, two errors in different scan cells in the compactor range have different signatures. Therefore, there is at least one register where these two errors affect two different flip-flops. In a general case, where the total number of scan cells is not limited by the compactor range, Theorem 6 below can be used to determine the probability of double error masking.

Theorem 6: The probability of double-error masking in a test response sequence of length N and a compactor of range R is $$\frac{a(2N - R(1 + a))}{N(N - 1)},$$

where $$a = \left\lfloor \frac{N}{R} \right\rfloor.$$

The proof for this theorem proceeds as follows. Two errors are masked if they are R positions apart in the scan chain. Number N can be represented as N=aR+(N−aR), where the first term, aR, represents a multiple of the compactor range and the second term, N−aR), is the remainder. Consider two cases: one where both errors are in the cells corresponding to the first term, and another where one error is in the cells corresponding to the first term and the second error is in the second term. The number of double errors in the first case that mask is a(a−1)R/2. In the second case, for every error in the remainder, there are a errors that are exactly R scan cells apart, and can mask each other. The number of errors in this case is (N−aR)a. The combined number of masked double errors is a(a−1)R/2+(N−aR)a and the total number of double errors is N(N−1)/2. Accordingly, the probability of double error masking is the ratio:

$$\frac{a(a-1)R/2 + (N - aR)a}{N(N-1)/2} \text{ or } \frac{a(2N - R(1 + a))}{N(N - 1)}.$$

A corollary to this theorem is that the probability of double error masking for a very large test sequence, N>>R, approaches $R^{-1}$.

Figure 10:
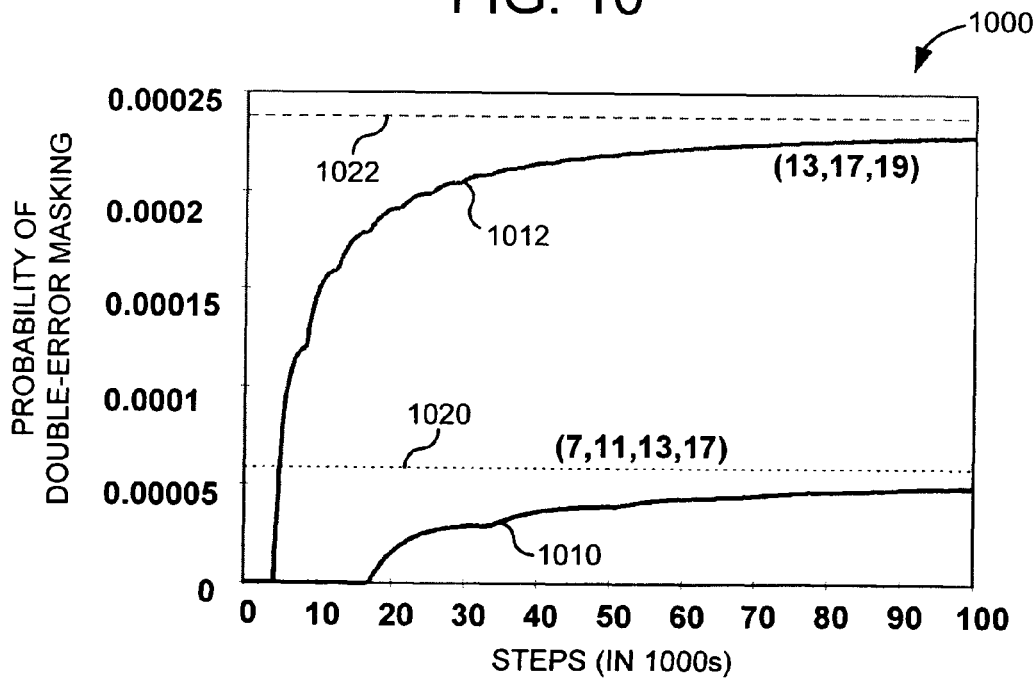
FIG. 10 is a graph showing the probability of double error masking for two exemplary compactors designed in accordance with the disclosed technology.

For example, FIG. 10 shows the probability of double error masking for two exemplary compactors: a 48-bit compactor having four registers of lengths 7, 11, 13, and 17 (shown in plot 1010) and a 49-bit compactor having three registers of lengths 13, 17, and 19 (shown in plot 1012) as a function of the number of scan cells in hundreds. In addition, FIG. 10 shows the corresponding asymptotic plots ($R^{-1}$) at plots 1020, 1022. Although the illustrated compactors have similar sizes, the first one has a four times greater range (17017 vs. 4199) such that double errors with a separation of 17017 or less do not experience masking.

According to experimental data, 2% of all failing test responses have quadruple errors per failing pattern. This percentage is significant enough to warrant further consideration. For purposes of the following discussion, an error sequence can be defined as a list of scan cell numbers that produce errors. In a two-register compactor ($r_1$, $r_2$) having the model configuration, an error sequence of $\{0, r_1, r_2, r_1+r_2\}$ results in masking on both registers. In fact, in a two-register compactor ($r_1$, $r_2$), the shortest quadruple error masking sequence is $\{0, r_1, r_2, r_1+r_2\}$.

The proof for this statement proceeds by first considering that an error sequence $\{0, r_1, r_2, r_1+r_2\}$ produces quadruple error masking. In particular, this failing response compacts to the following bits on the first register: 0, 0 ($r_1$ mod $r_1$), $r_2$ mod $r_1$, and ($r_1+r_2$)mod $r_1=r_2$ mod $r_1$. The first two errors mask each other on bit 0, the next two on bit $r_2$ mod $r_1$. Similar arguments apply to the second register. Assume that masking occurs for an error sequence a+$r_2$, where a<$r_1$, that is shorter than $r_1+r_2$, it can be shown that this is not possible. Because error a+$r_2$ requires error a, and error 0 requires $r_2$, the only sequence that could mask completely on the second register is $\{0, a, r_2, a+r_2\}$. In order to achieve complete masking, this error sequence should also mask on the first register. Since a is smaller than $r_1$ and because $r_2$ is relatively prime with respect to $r_1$, and therefore not a multiple of $r_1$, error 0 can only be masked by an error on cell a+$r_2$. For that to happen, a+$r_2$ has to be a multiple of $r_1$, a+$r_2$=k$r_1$, where k is an integer. The remaining two errors on a and $r_2$ must be separated by a multiple of $r_1$ in order to mask on the first register, $r_2$−a=l$r_1$, where l is an integer. The combined condition is 2a=(k−l)$r_1$, or 2a=j$r_1$, where j is an integer. Considering that $r_1$ is prime, j cannot be 1. If j is 2, a=$r_1$. For any other value of j, a is bigger than $r_1$. This proves that $\{0, r_1, r_2, r_1+r_2\}$ is the shortest sequence that produces quadruple error masking on two prime length registers.

Analysis of quadruple error masking in a modular compactor with three or more registers involves additional conditions. With respect to such a modular compactor, the following statement can be made: if there are no integers k and l such that (k$r_3$−l$r_2$)mod $r_1$=0, (k$r_3$+l$r_2$)mod $r_1$=0, and k$r_3$+l$r_2$<$r_1r_2$+$r_3$, then the shortest sequence of four errors that can produce masking in a three-register modular compactor is $\{0, r_1r_2, r_3, r_1r_2+r_3\}$. The proof for this statement follows a method similar to that used above.

Thus, in three-register model modular compactors of lengths (4,7,11), (4,9,13), and (6,13,19), quadruple-error masking occurs in 36, 44, and 96 cycles, instead of the nominal length, $r_1r_2+r_3$, which corresponds to 39, 49, and 97 cycles. Considering these masking conditions, certain embodiments of the disclosed compactors can be designed such that they use registers of a prime length and exclude registers having a length of 2. For such compactors, the minimum length of a four-error masking sequence is:

$$\min\left(\prod_{i\in A} r_i + \prod_{j\in B} r_j\right),$$

where A and B are disjoint and every register is either in A or B.

With such compactors, and for very large numbers of scan cells N>>R, quadruple error masking approaches $$\prod_{0}^{m-1} \left(\frac{3r_i - 2}{r_i^3}\right).$$

The proof for this statement proceeds by observing that on a single register of length $r_i$, quadruple error masking occurs if either all four errors map to the same flip-flop or to two flip-flops, each receiving two errors. In the first case there are $r_i$ masking combinations. In the second case there are $$\binom{r_i}{2}$$

combinations of pairs of flip-flops. Within each combination of two flip-flops, there are 6 different ways to assign pairs of errors: $\{(1,2),(3,4)\}$, $\{(1,3),(2,4)\}$, $\{(1,4),(2,3)\}$, $\{(2,3),(1,4)\}$, $\{(2,4),(1,3)\}$, and $\{(3,4),(1,2)\}$. The probability of masking on a single register is then $$\frac{\binom{r_i}{2}6 + r_i}{r_i^4},$$

which gives $$\frac{3r_i - 2}{r_i^3}.$$

Detection of Burst Errors

In this section, the ability of embodiments of the disclosed compactor to detect burst errors is discussed. As illustrated by the real fail logs in the previous section, the number of scan cell errors per failing pattern is typically very small. Very often they originate from the same defect location, propagate through one or two cones of logic to scan cells, and exhibit clustering effects that are well modeled by burst errors. In a test response with a burst error, erroneous bits cluster within a limited number of consecutive bits. Burst errors begin and end with an error bit, and the interleaving bits can be correct or incorrect. The length of the sequence from the first error to the last error defines the error span. In this discussion, only one burst error per signature readout is considered, which, in most cases, corresponds to a test response to a single scan pattern. In this section, it is further assumed that there are no X states in the test responses.

To investigate burst errors and the disclosed modular compactor architecture, the following question is considered: given a modular compactor having the model configuration with m circular registers of relatively prime length $r_0$, $r_1$, $r_2$, ..., $r_{m-1}$, what is the maximum span of a burst error that can be detected?

Theorem 7: The largest span of a burst error guaranteed to be detected in embodiments of a modular compactor having the model configuration with m circular registers of relatively prime length $r_0$, $r_1$, $r_2$, ..., $r_{m-1}$, is $\Sigma_0^{m-1} r_i - m+1$.

The proof of this theorem proceeds as follows. Without loss of generality, assume that the end error is located on scan cell 0. An error pattern is typically detected on a modular compactor if and only if a shifted version of the pattern is detected. In a modular compactor, any shifted version of an error typically results in the same number of error bits on a given circular register as in the original burst error. The shifted burst error rotates by the size of the shift. Ordinarily, every bit of a modular compactor performs an XOR operation on a set of variables corresponding to the contents of scan cells. Since scan cell 0 has the end error, its corresponding variable $c_0$=1.

This also implies that, if there were no other errors, bit zero of every register would have a value 1. The problem of finding the shortest self-masking burst sequence is defined as a system of simultaneous linear equations expressed in a matrix form: Ac=b, where A is a matrix of coefficients, with $a_{i,j}=1$, if and only if bit i of the compactor depends on variable j, vector c represents error variables associated with scan cells from 1 to $\Sigma_0^{m-1} r_i (c_0=1)$, and vector b represents the masking conditions on the bits of the compactor. Since the elements of b corresponding to 0 bits have value 1, while every other bit has a 0, this is a non-homogeneous system of linear equations.

Reduced echelon matrices computed for these systems reveal a couple of properties. Namely, there are only $\Sigma_0^{m-1} r_i - m+1$ rows, and m−1 redundant equations. Thus, for every register with the exception of one, there is one redundant equation. Because every error is injected into each register, the combined error parity on every register should be the same. There are no free variables within the first $\Sigma_0^{m-1} r_i - m+1$ columns. This means that this is a unique solution. Once the error bit corresponding to cell 0 is added, the minimum span of the self-masking burst error sequence can be determined as $\Sigma_0^{m-1} r_i - m+2$. Hence, the longest burst error guaranteed to be detected in embodiments of the modular compactor having the model configuration is $\Sigma_0^{m-1} r_i - m+1$.

Consider, for example, a model modular compactor with three registers of lengths 3, 7, 11. The shortest burst error that results in complete masking is a sequence 10111110100101111101 of length 20. This sequence produces an even number of errors on every bit of the compactor. The respective counts of injected errors on the bits listed from 0 to $r_i-1$ are as follows. On register 0, 1, and 2 it is {4, 4, 6}, {2, 2, 2, 2, 2, 2, 2}, and {2, 0, 2, 2, 2, 2, 2, 0, 2, 0, 0}. Indeed, there are 14 errors in the sequence, and every register accumulates all 14 of them. Thus, this exemplary compactor detects any burst error of length 19 or less.

Table II shows several example configurations of modular compactors with three, four, and five circular registers. The range indicates the maximum number of scan cells of a design that the compactors are most suitable to handle. The "Max Burst" column shows the maximum span error with guaranteed detection. For example, a compactor with three registers of lengths (37, 41, 43) and with a total of 121 bits can guarantee no masking for any burst error with a span of 119 or less. The biggest compactor in the table is a five-register, 331-bit compactor capable of compacting 12,000 scan patterns in a 100,000 scan cell design and can guarantee the detection of any burst error of span 327 or less.

TABLE II

Examples of model modular compactors, their ranges, and detectable burst errors

| R1 | R2 | R3 | R4 | R5 | Range | Sum | Max Burst |
|----|----|----|----|----|-------|-----|-----------|
| 5  | 7  | 11 |    |    | 385 | 23 | 21 |
| 11 | 13 | 17 |    |    | 2,431 | 41 | 39 |
| 17 | 19 | 23 |    |    | 7,429 | 59 | 57 |
| 23 | 29 | 31 |    |    | 20,677 | 83 | 81 |
| 37 | 41 | 43 |    |    | 65,231 | 121 | 119 |
| 41 | 43 | 47 |    |    | 82,861 | 131 | 129 |
| 47 | 53 | 59 |    |    | 146,969 | 159 | 157 |
| 59 | 61 | 67 |    |    | 241,133 | 187 | 185 |
| 11 | 13 | 17 | 19 |    | 46,189 | 60 | 57 |
| 17 | 19 | 23 | 29 |    | 215,441 | 88 | 85 |
| 23 | 29 | 31 | 37 |    | 765,049 | 120 | 117 |
| 31 | 37 | 41 | 43 |    | 2,022,161 | 152 | 149 |
| 41 | 43 | 47 | 53 |    | 4,391,633 | 184 | 181 |
| 47 | 53 | 59 | 61 |    | 8,965,109 | 220 | 217 |
| 13 | 17 | 19 | 23 | 29 | 2,800,733 | 101 | 97 |
| 23 | 29 | 31 | 37 | 41 | 31,367,009 | 161 | 157 |
| 37 | 41 | 43 | 47 | 53 | 162,490,421 | 221 | 217 |
| 47 | 53 | 59 | 61 | 67 | 600,662,303 | 287 | 283 |
| 59 | 61 | 67 | 71 | 73 | 1,249,792,339 | 331 | 327 |

Handling of Unknown States

Although not required, embodiments of the disclosed modular compactor architecture desirably have fanout-free feedback. For example, an X value injected into a circular register rotates without multiplying itself. By comparison, in a MISR, a single X value reaches all flip-flops in just a couple of cycles rendering the signature useless. Embodiments of a modular compactor having the model configuration exhibit at least two properties related to X masking:

First, if the number of scan cells is within the compactor's range, N<R+1, an X value in a single scan cell does not mask the observability of any other scan cell. This property is a derivative of Theorem 1. With the total number of scan cells being within the compactor range, N<R+1, every scan cell maps to a different set of flip-flops in exemplary embodiments of the compactor having the model configuration. Therefore, there is at least one register where the error and the X value map to different flip-flops, thus enabling detection of the error.

Second, if the compacted response contains z unknown values and its length is much larger than the period of the compactor, N>>R, the probability of X masking of a single scan cells is $$\prod_0^{m-1} (1 - (1 - r_i^{-1})^z).$$

To examine the masking probabilities of multiple errors in modular compactors, at least two approaches can be used. According to the first approach, the independence of the operation of the registers is assumed, which is equivalent to assuming that the scan chains are much longer than the compactor range. This assumption simplifies the analysis while giving an upper bound for the actual masking probability. The second approach uses Monte Carlo simulation.

In order to illustrate the masking probability of multiple errors in the presence of multiple X sates, two graphs are introduced. An X-graph represents the accumulation of X values in a single register of the compactor, whereas an E-graph models the interaction of errors with the X values.

Figure 11:
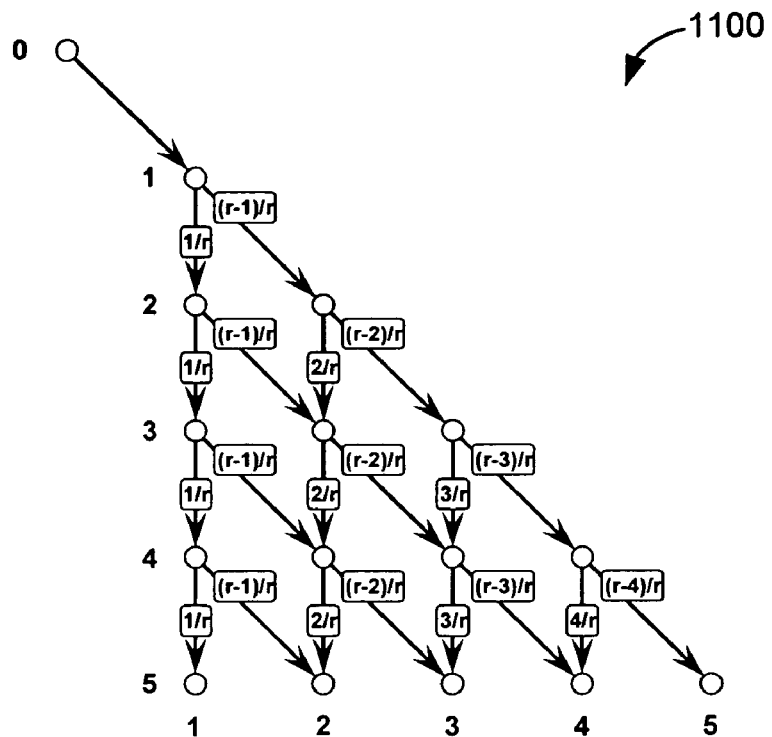
FIG. 11 shows an example of an X-graph modeling the accumulation of X values on one r-bit register of a compactor designed in accordance with the disclosed technology.

FIG. 11 shows an exemplary X-graph 1100 modeling the accumulation of X values on one r-bit register of a compactor having the model configuration. An X-graph like this can be constructed for every register of the compactor. The rows of the graph correspond to the number of injected X values, whereas the columns correspond to the effective number of X values that remain in the register. For purposes of this discussion, the graph can have at most r columns regardless of the number of injected X values. The edges of the graph correspond to the possible state changes and the labels indicate the transition probabilities. Initially, the top node has a probability of 1. After injecting a single X value, the system moves to a single effective X value. From this state, another injection of an X value causes a transition to a state with two effective X values with probability $(r-1)/r$, when the second injection does not coincide with the location of the first X. The graph can also remain in a state with a single X value with a probability of $1/r$. The probabilities of different distributions of X values are computed row by row. The last row, in this example, shows the probability of 1, 2, 3, 4, and 5 X values after the random injection of 5 X values. The sum of probabilities in every row adds up to 1. In general, for a given size of the register $r_j$ and the total number of X values U, this graph computes the distribution of probabilities $p^x_i(r_j, U)$, for $i=0, 1, 2, \ldots r_i-1$.

Figure 12:
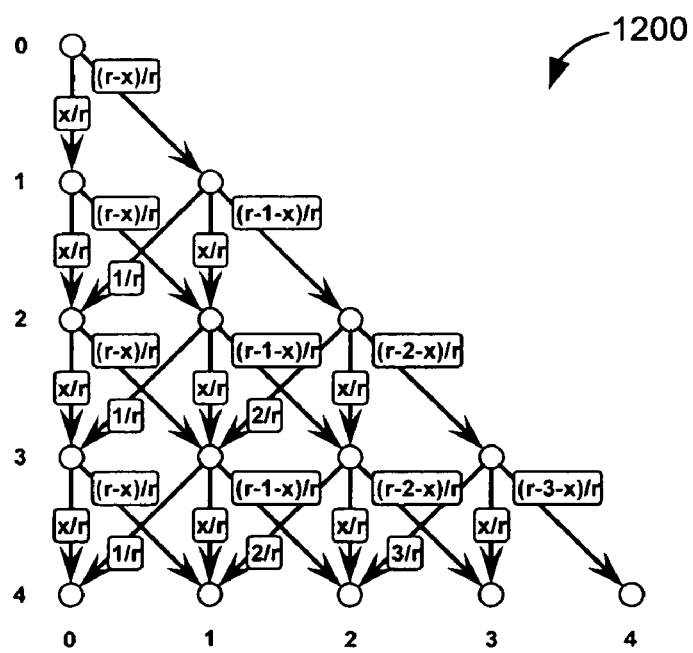
FIG. 12 shows an E-graph that can be used to compute error masking in a compactor designed in accordance with the disclosed technology.

Once the distribution of X value probabilities is determined by the X-graph, the error masking can be computed using an E-graph, such as graph 1200 shown in FIG. 12. In this graph, it is assumed that there are effectively x bits with X values in the register. The process is invoked for each node in the bottom row of the previous graph to determine the probability of error masking for 1, 2, 3, 4, and 5 X values, and the probability of error masking is computed. The sum of these probabilities determines error masking for the whole register. The rows relate to the number of injected errors, whereas the columns correspond to the actual number of errors e outside of the bits with X states. The left-most node in each row corresponds to error masking. In general, if a register is in a state with x bits with X values and e bits in error (x,e), upon injection of a single error the system can move to one of three states: (a) state (x,e−1) with probability e/r when the new error hits one of the position already in error causing error cancellation, (b) state (x,e+1) with probability (r−x−e)/r when the new error hits a bit with no error and no X value, or (c) the same state (x,e) with probability x/r when the new error hits one of the bits with the X value. In this example, the total number of compactor bits with an X value and error value cannot exceed the total number of flip-flops in the register.

The illustrated example illustrates the process of injecting four errors into an r-bit register that has x bits with unknown (or X) values. In general, for a given number of bits, i, with X values in the register of size $r_j$ and a total number of errors E, this graph can be used to compute the probability of error masking $p^e_i(r_j, E)$. By combining these two graphs, the masking probability of E errors with UX values can be obtained:

$$\prod_{j=0}^{m-1}\left(\sum_{i=0}^{r_j-1} p^x_i(r_j, U) p^e_i(r_j, E)\right).$$

Figure 13:
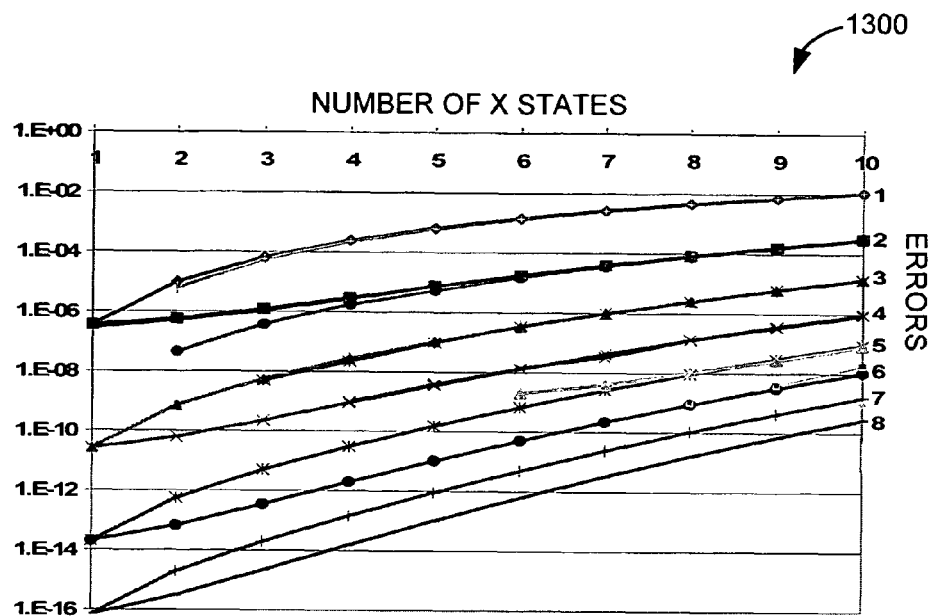
FIG. 13 is a graph showing the probability of error X-masking for errors ranging in multiplicity from 1 to 8 for a number of X values ranging from 1 to 10 in an exemplary five-register modular compactor designed in accordance with the disclosed technology.

FIG. 13 is a graph 1300 showing the probability of error X-masking for errors ranging in multiplicity from 1 to 8 and a number of X values ranging from 1 to 10 in an exemplary 101-bit modular compactor having five registers of lengths (13, 17, 19, 23, 29). The graph 1300 contains the graph-based calculations superimposed by Monte Carlo experiments. For every error multiplicity, Monte Carlo experiments were performed for scan chains significantly longer that the compactor range (specifically, 100,000,000 vs. 2,800,733). In these cases, the results obtained from using these two methods were very similar. For double errors, Monte Carlo experiments were also performed for a 100,000 scan-cell structure. Since the number of scan cells was within the compactor range, the error masking for two and three X states was reduced to less than $10^{-6}$.

Figure 14:
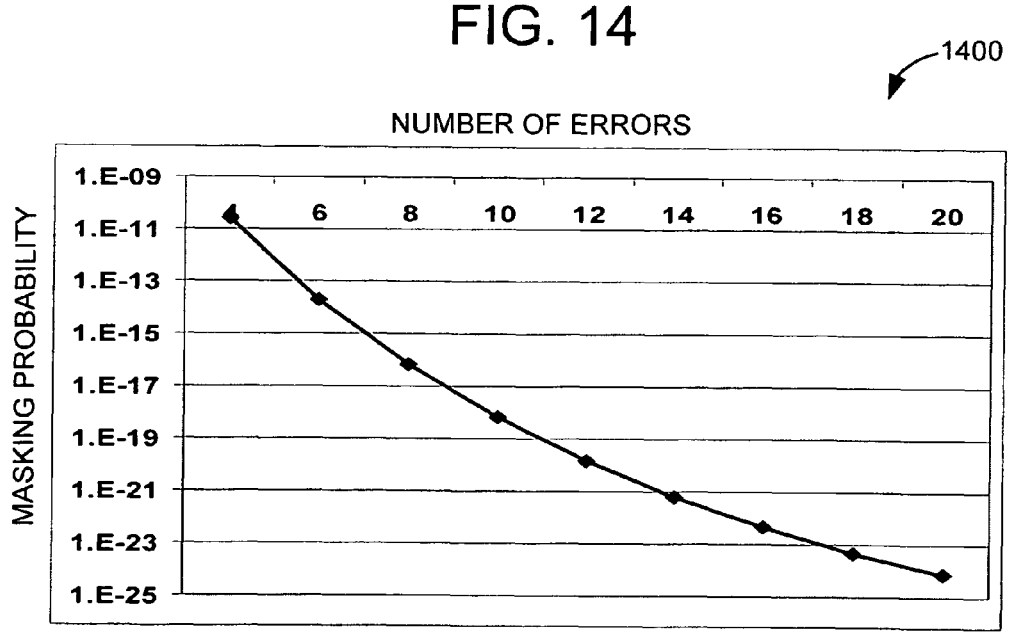
FIG. 14 is a graph showing the probability of error X-masking for the exemplary modular compactor considered in FIG. 13.

As seen in FIG. 13, for triple errors, the exemplary compactor can tolerate up to 7 X values and maintain error masking under $10^{-6}$. Furthermore, the exemplary 101-bit modular compactor can read one signature per scan pattern, providing close to 1000 times compaction of volume of test data on a design with 100,000 scan cells (100,000/101). For this exemplary configuration, the detection of double errors and no X values is guaranteed. Similarly, in this example, there is no masking of single errors by a single X value. The E-graph can be used to compute the probability of masking of even errors. FIG. 14 shows the masking probability of errors ranging from 4 to 20 for the same exemplary modular compactor.

As illustrated above, certain exemplary embodiments of the modular compactor architecture described herein can detect certain multiplicities of errors in the absence of X states. Furthermore, even in the presence of X states, certain embodiments of the disclosed compactor can exhibit a high level of X-state tolerance. For example, certain embodiments of the model modular compactor can detect all single errors in the presence of an X state and have very low probabilities of X-state masking when double errors are present. Consider, for instance, an exemplary model modular compactor with four circular registers of relatively prime length (23, 29, 37, 41). The exemplary modular compactor thus has a combined length of 130 bits and a large enough range (1,011,839) to accommodate a design with one million scan cells. The exemplary compactor can detect every double error in the absence of X states. Further, the exemplary compactor can detect every double error in the absence of X states, and the probability of double-error masking with a single X value is still at a very respectable level of $10^{-7}$. As another example, consider a model modular compactor having five registers of lengths (13, 17, 19, 23, 29). In this example, the probability of not detecting three errors in the presence of two X values in the uncompacted response is $10^{-9}$ (FIG. 13).

Embodiments of the disclosed modular compactor architecture also have a relative simple design. A simple demultiplexing structure, such as demultiplexing circuitry 1510 shown in FIG. 15, for example, can use the shifting of the registers to read-out signatures stored within the circular registers of compactor 1500. The illustrated demultiplexing circuitry 1510, for instance, comprises a controller 1512 that can selectively control any of the demultiplexers 1513, 1514, 1515 coupled to the feedback loops of the circular registers 1520 such that the contents of any of the registers can be individually read out of the compactor 1500 through OR gate 1516. The controller 1512 can be configured, for instance, to read the contents out of the compactor 1500 after fixed intervals of clock cycles or upon activation of an external control signal. No shadow register is required in this exemplary embodiment.

Exemplary Network Environments

Figure 16:
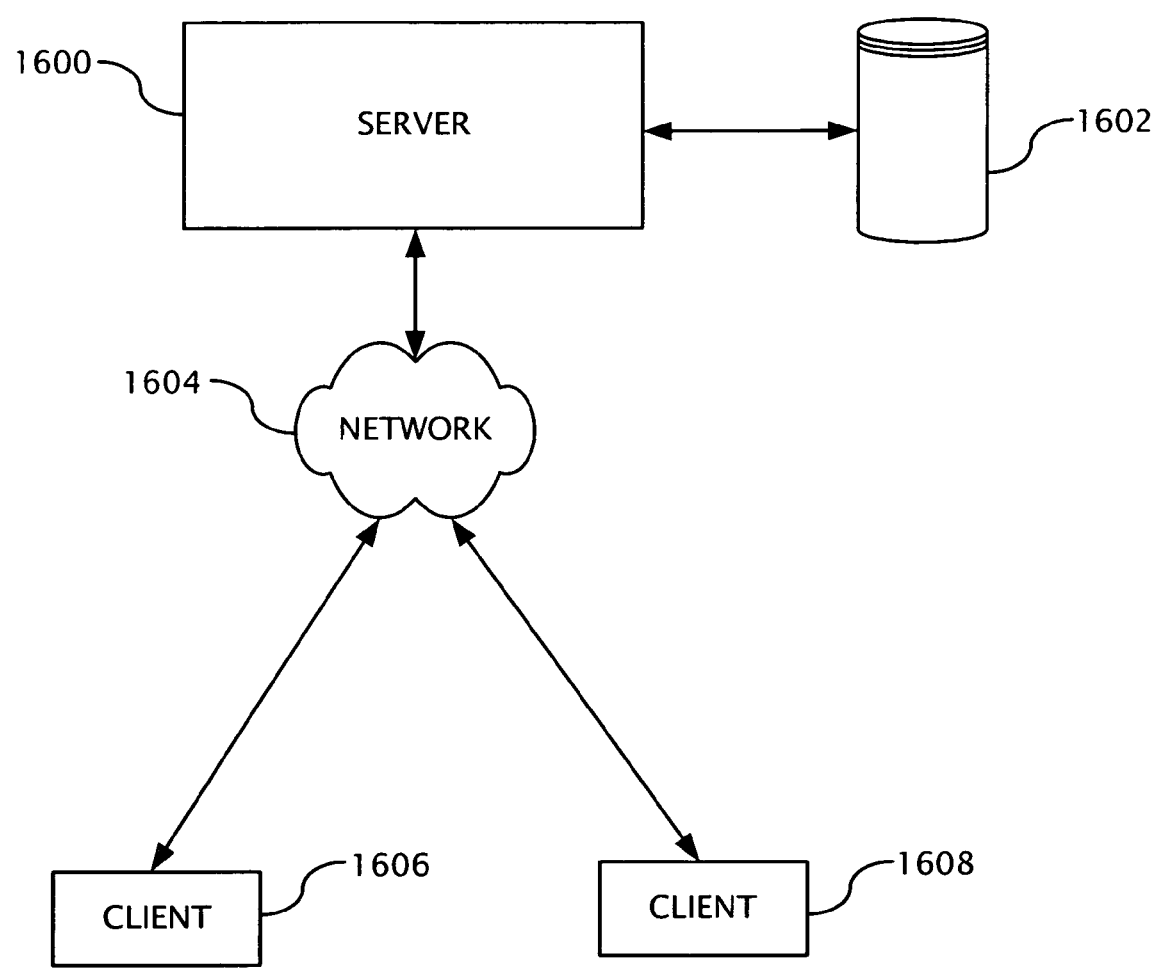
FIG. 16 is a schematic block diagram of a network as may be used to perform any of the disclosed methods or to generate any of the disclosed compactor embodiments.

Any of the aspects of the technology described above may be performed using a distributed computer network. FIG. 16 shows one suitable exemplary network. A server computer 1600 can have an associated storage device 1602 (internal or external to the server computer). For example, the server computer 1600 can be configured to generate any of the disclosed modular compactor embodiments for a given circuit-under-test (for example, as part of an EDA software tool, such as a test pattern generation tool) or to perform diagnostics for signatures produced by any of the disclosed embodiments (for example, as part of a diagnostic software tool). The server computer 1600 can be coupled to a network, shown generally at 1604, which can comprise, for example, a wide-area network, a local-area network, a client-server network, the Internet, or other suitable network. One or more client computers, such as those shown at 1606, 1608, may be coupled to the network 1604 using a network protocol. The work may also be performed on a single, dedicated workstation, which has its own memory and one or more CPUs.

Figure 17:
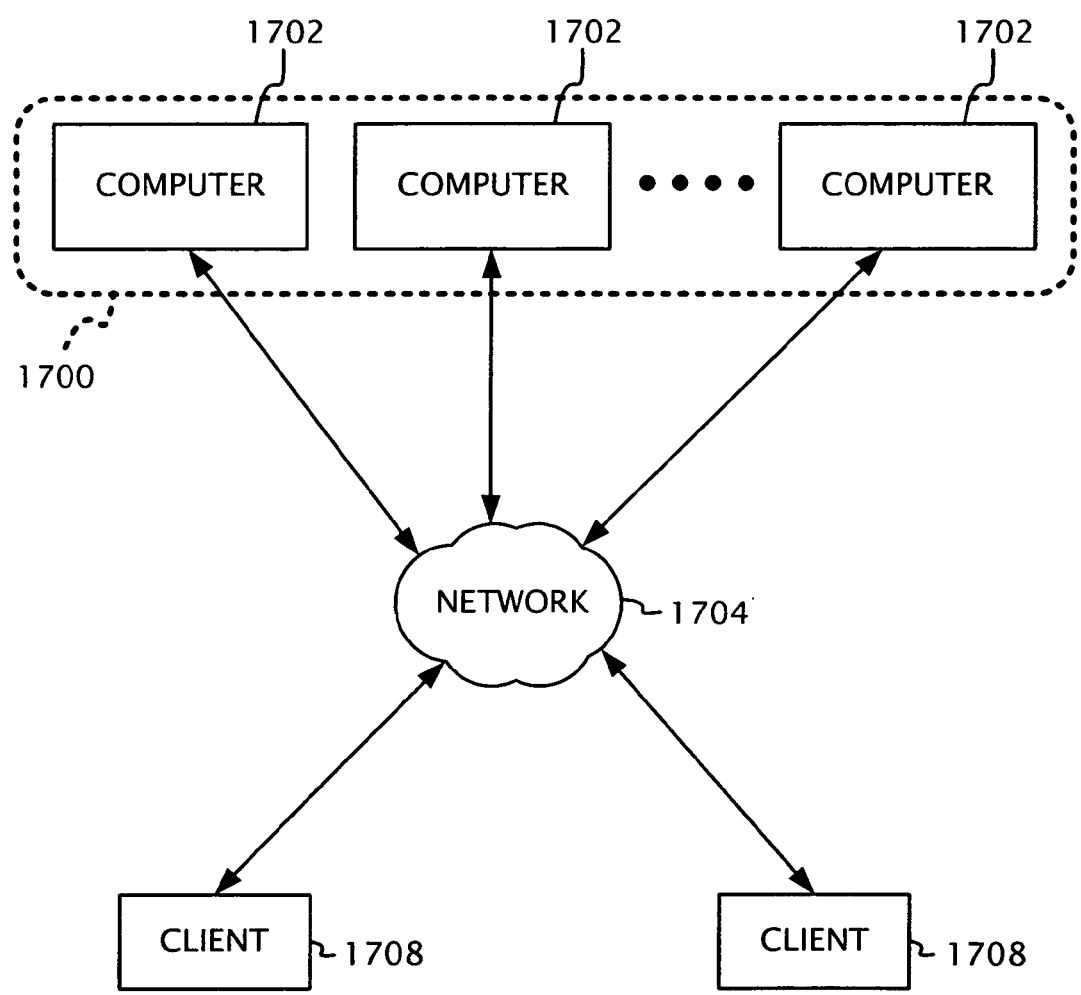
FIG. 17 is a schematic block diagram of a distributed computing network as may be used to perform any of the disclosed methods or to generate any of the disclosed compactor embodiments.

FIG. 17 shows another exemplary network. One or more computers 1702 communicate via a network 1704 and form a computing environment 1700 (for example, a distributed computing environment). Each of the computers 1702 in the computing environment 1700 can be used to perform at least a portion of the compactor generation process or diagnostic process. The network 1704 in the illustrated embodiment is also coupled to one or more client computers 1708.

Figure 18:
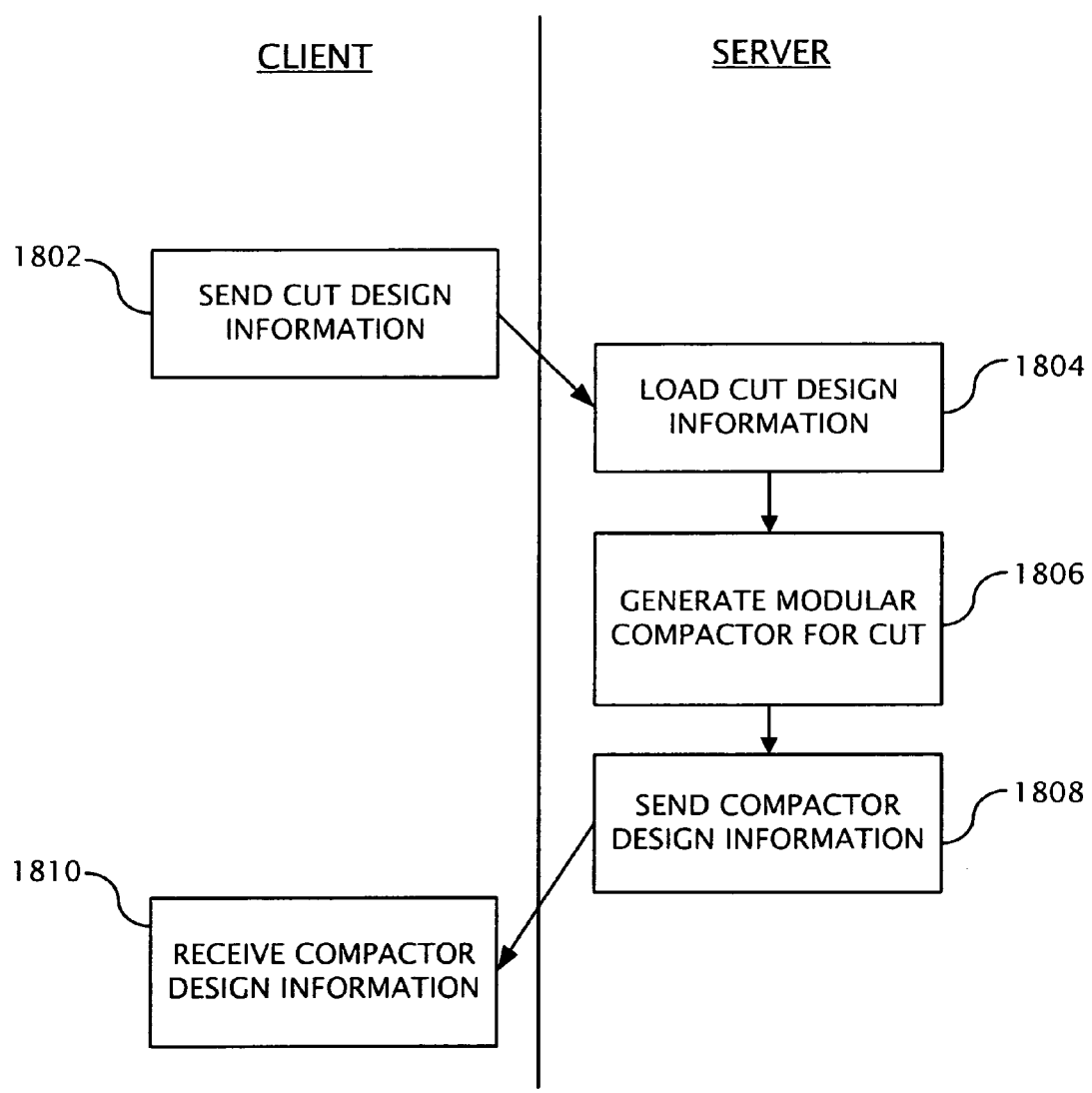
FIG. 18 is a flowchart illustrating how an embodiment of the disclosed modular compactor can be generated in the network of FIG. 16 or FIG. 17.

FIG. 18 shows that design information for a circuit-under-test (e.g., an HDL file, netlist, GDSII file, Oasis file, or other suitable design file representing the circuit-under-test together with its scan chains) can be analyzed using a remote server computer (such as the server computer 1600 shown in FIG. 16) or a remote computing environment (such as the computing environment 1700 shown in FIG. 17) in order to generate a suitable modular compactor according to the disclosed technology. At process block 1802, for example, the client computer sends the circuit-under-test (CUT) design information to the remote server or computing environment. In process block 1804, the CUT design information is received and loaded by the remote server or by respective components of the remote computing environment. In process block 1806, compactor generation is performed to produce design information for any of the disclosed compactor embodiments. At process block 1808, the remote server or computing environment sends the resulting design information (e.g., an HDL file, netlist, GDSII file, Oasis file, or other suitable design file representing the compactor either alone or together with the circuit-under-test and scan chains) to the client computer, which receives the data at process block 1810.

It should be apparent to those skilled in the art that the example shown in FIG. 18 is not the only way to generate a compactor using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the compactor design procedures. Similar procedures using a remote server or computing environment can be performed to diagnose signatures produced by embodiments of the disclosed compactor architecture.

The foregoing embodiments illustrate architectures of a time compactor that can be used to achieve a variety of performance characteristics. The embodiments can be useful for on-chip test compression as well as Built-In Self-Test (BIST) applications. Among the various features that can be realized by embodiments of the disclosed compactor architecture (either alone or in various combinations or subcombinations with one another) are: (1) an ability to detect a range of real defects, such as errors of odd multiplicity, double, and quadruple errors; (2) a feedback structure for registers that can prevent the multiplication of X states, which is a common problem in signature registers based on MISRs (for example, embodiments of the compactor can tolerate a small number of X states in test responses without the masking of errors); and (3) compactor operation that can be used with formal methods of modular arithmetic to identify erroneous scan cells (for example, Chinese remaindering can be used to identify erroneous scan cells based on sets of one or more remainders).

Having illustrated and described the principles of the illustrated embodiments, it will be apparent to those skilled in the art that the embodiments can be modified in arrangement and detail without departing from such principles. For example, one or more registers (e.g., shadow registers) can be used to receive and store (in parallel or serially) values from the outputs of the compactor. Any of the components described above can also be made using a wide variety of different logic gates to achieve the desired functionality. In addition to the demultiplexing and control circuitry described above, the disclosed compactor can be used with a variety of other demultiplexing, selection, and control circuits known in the art.

In view of the many possible embodiments, it will be recognized that the illustrated embodiments include only examples and should not be taken as a limitation on the scope of the invention. Rather, the invention is defined by the following claims and their equivalents. We therefore claim as the invention all such embodiments and equivalents that come within the scope of these claims.

We claim:

1. A circuit for compacting test responses of a circuit-under-test, the circuit comprising:
    two or more circular registers comprising sequential elements and input logic gates, the input logic gates being configured to receive test response bits and to logically combine the test response bits with bits stored within a respective one of the circular registers;
    a first path having a first-path input coupled to a first scan chain output and having first-path outputs coupled to a first set of the input logic gates; and
    a second path having a second-path input coupled to a second scan chain output and having second-path outputs coupled to a second set of the input logic gates, the second set comprising at least one input logic gate that is different than the input logic gates in the first set.

2. The circuit of claim 1, wherein each of the two or more circular registers has a length corresponding to the number of sequential elements in the respective register, and wherein the lengths of the two or more circular registers are relatively prime.

3. The circuit of claim 1, wherein each of the two or more circular registers has a length corresponding to the number of sequential elements in the respective register, and wherein the lengths of the two or more circular registers are prime.

4. The circuit of claim 1, wherein the input logic gates are XOR or XNOR gates.

5. The circuit of claim 1, further comprising a demultiplexing circuit coupled to the two or more circular registers, the demultiplexing circuit being selectively controllable to output signatures stored in the two or more circular registers.

6. One or more computer-readable storage devices storing circuit design information for implementing the circuit of claim 1.

7. One or more computer-readable storage devices storing computer-executable instructions for causing a computer to create-a circuit for compacting test responses of a circuit-under-test, the circuit comprising:
    two or more circular registers comprising sequential elements and input logic gates, the input logic gates being configured to receive test response bits and to logically combine the test response bits with bits stored within a respective one of the circular registers;
    a first path having a first-path input coupled to a first scan chain output and having first-path outputs coupled to a first set of the input logic gates; and
    a second path having a second-path input coupled to a second scan chain output and having second-path outputs coupled to a second set of the input logic gates, the second set comprising at least one input logic gate that is different than the input logic gates in the first set.

8. The one or more computer-readable storage devices of claim 7, wherein each of the two or more circular registers has a length corresponding to the number of sequential elements in the respective register, and wherein the lengths of the two or more circular registers are prime or relatively prime.

9. The one or more computer-readable storage devices of claim 7, wherein the circuit further comprises a demultiplexing circuit coupled to the two or more circular registers, the demultiplexing circuit being selectively controllable to output signatures stored in the two or more circular registers.

10. A circuit for compacting test responses in a circuit-under-test, the circuit comprising:
   a first register comprising first-register sequential elements and a first-register feedback loop, at least some of the first-register sequential elements being coupled together through one or more first-register logic gates;
   a second register comprising second-register sequential elements and a second-register feedback loop, at least some of the second-register sequential elements being coupled together through one or more second-register logic gates; and
   an injector network, the injector network being configured to couple a first scan-chain output to a first respective first-register logic gate and to a first respective second-register logic gate,
   the injector network being further configured to couple a second scan-chain output to the first respective first-register logic gate and to a second respective second-register logic gate different than the first respective second-register logic gate.

11. The circuit of claim 10, wherein at least one of the first-register feedback loop or the second-register feedback loop is fanout free.

12. The circuit of claim 10, wherein the first-register feedback loop couples the output of a last sequential element in the first register to the input of a first sequential element in the first register.

13. The circuit of claim 12, wherein the second-register feedback loop couples the output of a last sequential element in the second register to the input of a first sequential element in the second register.

14. The circuit of claim 10, wherein the first register and the second register are circular registers.

15. One or more computer-readable storage devices storing circuit design information for the circuit of claim 10.

16. One or more computer-readable storage devices storing computer-executable instructions for causing a computer to create-circuit design information for a circuit, the circuit comprising:
   a first register comprising first-register sequential elements and a first-register feedback loop, at least some of the first-register sequential elements being coupled together through one or more first-register logic gates;
   a second register comprising second-register sequential elements and a second-register feedback loop, at least some of the second-register sequential elements being coupled together through one or more second-register logic gates; and
   an injector network, the injector network being configured to couple a first scan-chain output to a first respective first-register logic gate and to a first respective second-register logic gate,
   the injector network being further configured to couple a second scan-chain output to the first respective first-register logic gate and to a second respective second-register logic gate different than the first respective second-register logic gate.

17. The one or more computer-readable storage devices of claim 16, wherein at least one of the first-register feedback loop or the second-register feedback loop is fanout free.

18. The one or more computer-readable storage devices of claim 16, wherein the first-register feedback loop couples the output of a last sequential element in the first register to the input of a first sequential element in the first register.

19. The one or more computer-readable storage devices of claim 16, wherein the second-register feedback loop couples the output of a last sequential element in the second register to the input of a first sequential element in the second register.

20. The one or more computer-readable storage devices of claim 16, wherein the first register and the second register are circular registers.

21. A method, comprising:
   loading a first test response bit into a first set of sequential elements; and
   loading a second test response bit into a second set of sequential elements,
   both the first set of sequential elements and the second set of sequential elements comprising at least one sequential element in a first circular register and at least one sequential element in a second circular register,
   the second set further comprising at least one sequential element that is different from the sequential elements of the first set.

22. The method of claim 21, wherein the first and the second test response bits are loaded through logic gates in the first and the second circular registers that combine the test response bits with bits previously stored in the respective circular registers.

23. The method of claim 21, wherein the acts of loading the first test response bit and loading the second test response bit occur during a same clock cycle.

24. The method of claim 21, wherein the first test response bit and the second test response bit are both error bits, the method further comprising generating a signature indicative of the presence of the error bits.

25. The method of claim 24, wherein the first test response bit and the second test response bit are error bits captured in any two scan cells of a circuit-under-test.

26. The method of claim 21, wherein the first test response bit is an error bit, the method further comprising generating a signature indicative of the presence of the error bit and an identity of a scan cell in a circuit-under-test that captured the error bit.

27. The method of claim 26, wherein the first test response bit is an error bit captured in any scan cell of a circuit-under-test.

28. The method of claim 21, wherein the first test response bit is an error bit and the second test response bit has an unknown state, the method further comprising generating a signature indicative of the presence of the error bit.

29. The method of claim 28, wherein the first test response bit is an error bit captured in any scan cell of a circuit-under-test, and the second test response bit is an unknown state captured in any other scan cell of the circuit-under-test.

30. The method of claim 21, wherein the first test response bit is received from a first scan chain output and the second test response bit is received from a second scan chain output.

31. A compactor configured to perform the method of claim 21.

32. A computer-implemented method, comprising:
   receiving circuit design information for a circuit, the circuit design information including design information for two or more scan chains;

with a computer, creating compactor design information for implementing a test response compactor for the circuit, the act of creating the compactor design information including creating an injector network for coupling scan chain outputs of at least two of the scan chains to at least two circular registers; and storing the compactor design information.

33. The computer-implemented method of claim 32, wherein the act of creating the injector network comprises creating pathways between the scan chain outputs and the circular registers such that each of the scan chain outputs is coupled to at least one input logic gate configured to load a respective sequential element in each of the at least two circular registers.

34. The computer-implemented method of claim 32, wherein the act of creating the injector network comprises:
creating a first pathway that couples a first scan chain output to a first set of sequential elements; and
creating a second pathway that couples a second scan chain output to a second set of sequential elements, wherein the first set and the second set include at least one sequential element in each of the at least two circular registers, and wherein the second set includes at least one sequential element not coupled to the first scan chain output.

35. The computer-implemented method of claim 32, wherein the act of creating the injector network comprises creating a pathway that couples a scan chain j having a leading scan cell number jL to a sequential element jL mod r of a selected one of the circular registers, where r is the length of the selected circular register, the sequential elements within the selected register are numbered consecutively, the scan cells in the two or more scan chains are numbered consecutively, and the length of the two or more scan chains is L such that the scan chain j has the leading scan cell jL.

36. The computer-implemented method of claim 32, wherein the two or more circular registers have respective lengths that do not share a common divisor.

37. The computer-implemented method of claim 32, wherein the two or more circular registers have respective lengths that are prime.

38. One or more computer-readable storage devices storing computer-executable instructions for causing a computer to implement a method comprising:
receiving circuit design information for a circuit, the circuit design information including design information for two or more scan chains;
creating compactor design information for implementing a test response compactor for the circuit, the act of creating the compactor design information including creating an injector network for coupling scan chain outputs of at least two of the scan chains to at least two circular registers; and
storing the compactor design information.

39. The one or more computer-readable storage devices of claim 38, wherein the act of creating the injector network comprises creating pathways between the scan chain outputs and the circular registers such that each of the scan chain outputs is coupled to at least one input logic gate configured to load a respective sequential element in each of the at least two circular registers.

40. The one or more computer-readable storage devices of claim 38, wherein the act of creating the injector network comprises:
creating a first pathway that couples a first scan chain output to a first set of sequential elements; and
creating a second pathway that couples a second scan chain output to a second set of sequential elements, wherein the first set and the second set include at least one sequential element in each of the at least two circular registers, and wherein the second set includes at least one sequential element not coupled to the first scan chain output.

41. The one or more computer-readable storage devices of claim 38, wherein the two or more circular registers have respective lengths that are prime or relatively prime.

42. A computer-implemented method, comprising:
receiving one or more failing signatures from a multiple-input time compactor, the multiple-input time compactor comprising (a) two or more circular registers comprising sequential elements and input logic gates, the input logic gates being configured to receive test response bits and to logically combine the test response bits with bits stored within a respective one of the circular registers, (b) a first path having a first-path input coupled to a first scan chain output and having first-path outputs coupled to a first set of the input logic gates, and (c) a second path having a second-path input coupled to a second scan chain output and having second-path outputs coupled to a second set of the input logic gates, the second set comprising at least one input logic gate that is different than the input logic gates in the first set;
determining positions of one or more failing bits in a selected failing signature of the one or more failing signatures;
identifying one or more scan cells that captured faulty test response values by applying modular arithmetic to the determined positions of the one or more failing bits; and
storing a list of the one or more identified scan cells.

43. The computer-implemented method of claim 42, wherein the act of identifying the one or more scan cells that captured faulty test response values includes determining $$c = \left(\sum_{i=0}^{m-1} q_i z_i s_i\right) \bmod R,$$

where c is a scan cell number that originated the error, m is the total number of circular registers in the time compactor, r, is the length of a circular register i, $$q_i = \left(\prod_{j=0}^{m-1} r_j\right) / r_i, z_i$$

is the inverse $q_i^{-1}$ mod $r_i$, $s_i$ is the position in the signature of circular register i having an error bit, and R is the product of the lengths of all the circular registers in the time compactor.

44. One or more computer-readable storage devices storing computer-executable instructions for causing a computer to implement a method comprising:
receiving one or more failing signatures from a multiple-input time compactor, the time compactor comprising (a) a first register comprising first-register sequential elements and a first-register feedback loop, at least some of the first-register sequential elements being coupled together through one or more first-register logic gates, (b) a second register comprising second-register sequential elements and a second-register feedback loop, at least some of the second-register sequential elements being coupled together through one or more second-register logic gates, and (c) an injector network, the injector network being configured to couple a first scan-chain output to a first respective first-register logic gate and to a first respective second-register logic gate, the injector network being further configured to couple a second scan-chain output to the first respective first-register logic gate and to a second respective second-register logic gate different than the first respective second-register logic gate;

determining positions of one or more failing bits in a selected failing signature of the one or more failing signatures;

identifying one or more scan cells that captured faulty test response values by applying modular arithmetic to the determined positions of the one or more failing bits; and storing a list of the one or more identified scan cells.

* * * * *

UNITED STATES PATENT AND TRADEMARK OFFICE
CERTIFICATE OF CORRECTION

PATENT NO. : 8,161,338 B2
APPLICATION NO. : 11/580650
DATED : April 17, 2012
INVENTOR(S) : Rajski et al.

It is certified that error appears in the above-identified patent and that said Letters Patent is hereby corrected as shown below:

In the Specification:

Column 4, line 55, " $c = \left( \sum_{i=0}^{m-1} q_i z_i s_i \right) \mod R$ " should read -- $c = \left( \sum_{i=0}^{m-1} q_i z_i s_i \right) \mod R$ --.

Column 10, line 15, "where $\check{r}$" should read --where r--.

Column 11, line 55, " $c = \left( \sum_{i=0}^{m-1} q_i z_i s_i \right) \mod R$ " should read -- $c = \left( \sum_{i=0}^{m-1} q_i z_i s_i \right) \mod R$ --.

In the Claims:

Column 22, claim 7, line 53, "create-a" should read --create a--.

Column 23, claim 16, line 48, "create-circuit design" should read --create circuit-design--.

Signed and Sealed this
Eighth Day of January, 2013

David J. Kappos
*Director of the United States Patent and Trademark Office*